United States Patent
Soma et al.

(10) Patent No.: US 6,525,523 B1
(45) Date of Patent: Feb. 25, 2003

(54) JITTER MEASUREMENT APPARATUS AND ITS METHOD

(75) Inventors: Mani Soma, Seattle, WA (US); Masahiro Ishida, Tokyo (JP); Takahiro Yamaguchi, Tokyo (JP); Toshifumi Watanabe, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/722,167

(22) Filed: Nov. 24, 2000

(51) Int. Cl.⁷ .............................................. G01R 25/00
(52) U.S. Cl. ..................................... 324/76.77; 375/226
(58) Field of Search ........................... 324/76.39, 76.41, 324/76.52, 76.77; 375/224, 226, 371, 375

(56) References Cited

U.S. PATENT DOCUMENTS

| | | | | |
|---|---|---|---|---|
| 4,654,861 A | * | 3/1987 | Godard ........................ | 375/10 |
| 5,341,155 A | * | 8/1994 | Elrod et al. .................. | 345/179 |
| 6,185,509 B1 | * | 2/2001 | Wilstrup et al. ............... | 702/69 |
| 6,240,130 B1 | * | 5/2001 | Burns et al. ................. | 375/226 |
| 6,291,979 B1 | * | 9/2001 | Soma et al ............... | 324/76.82 |
| 6,295,315 B1 | * | 9/2001 | Frisch et al. ................ | 375/226 |

* cited by examiner

Primary Examiner—N. Le
Assistant Examiner—Etienne P LeRoux
(74) Attorney, Agent, or Firm—David N. Lathrop, Esq.; Gallagher & Lathrop

(57) ABSTRACT

A signal under measurement is transformed into a complex analytic signal using Hilbert transformation to estimate an instantaneous phase of the signal under measurement from the complex analytic signal. A zero-crossing timing sequence of the signal under measurement is estimated using the instantaneous phase. An instantaneous period sequence of the signal under measurement is estimated from the zero-crossing timing sequence to obtain a jitter of the signal under measurement from the instantaneous period sequence.

24 Claims, 28 Drawing Sheets

Jitter Measurement Apparatus 100

PRIOR ART

|  | MEASURED | 1-SIGMA | PK-PK | MAXIMUM | MINIMUM | EVENTS | # PASSES |
|---|---|---|---|---|---|---|---|
| LATEST | 2479.1 | 7.56 | 37.2 | 2497.6 | 2460.3 | 500 |  |
| OVERALL | 2478.5 | 7.72 | 48.2 | 2504.9 | 2456.7 | 10000 | 20 |

Number of Events: 4,573
RMS Jitter: 8.47 ps
Peak-to-Peak Jitter: 52.0 ps

FIG. 12

| Method | | No. of Events | $J_{RMS}$ | $J_{PP}$ |
|---|---|---|---|---|
| Time Interval Analyzer | | 10,000 | 7.72 ps | 48.2 ps |
| $\Delta\phi$ Method | | 4,696 | 7.49 ps | 45.5 ps |
| Proposed Method | | 4,696 | 7.48 ps | 45.5 ps |
| Difference | Proposed Method vs Time Interval Analyzer | -53% | -3.1% | +1.0% |
| | Proposed Method vs $\Delta\phi$ Method | 0% | -0.1% | 0% |

PRIOR ART

FIG. 20        PRIOR ART
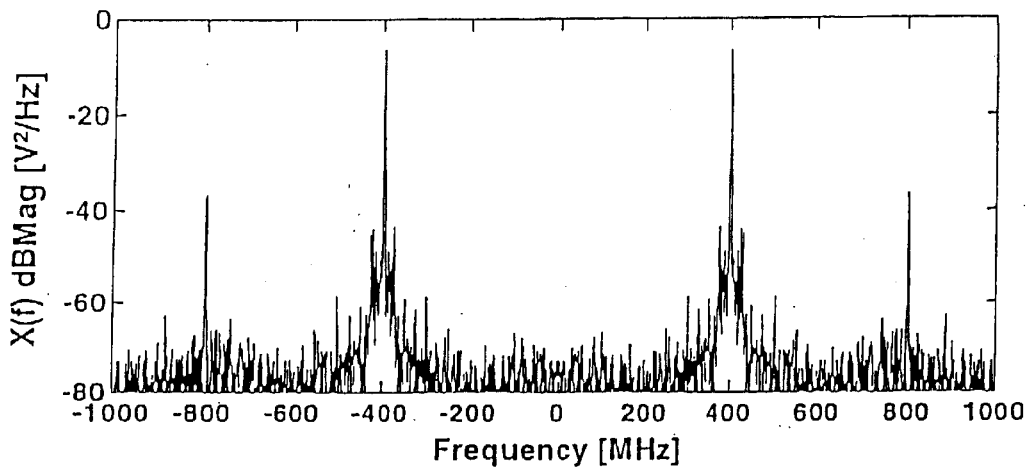
FIG. 21        PRIOR ART
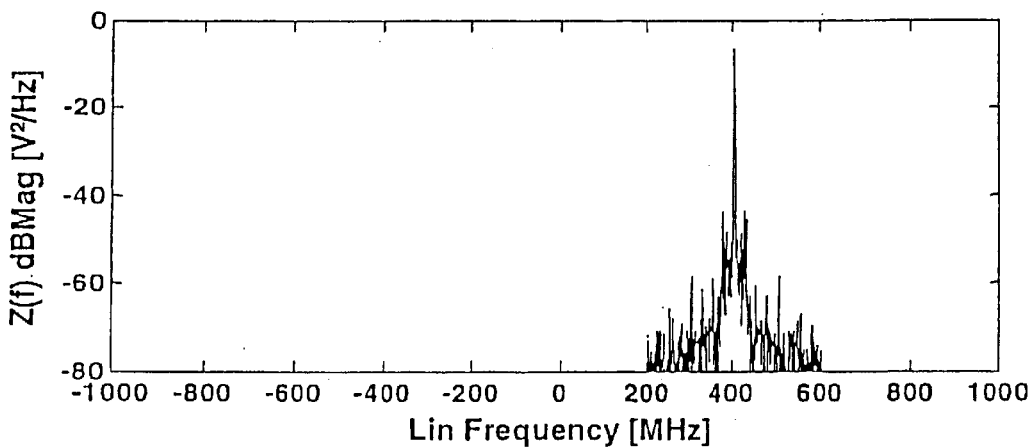
FIG. 22        PRIOR ART
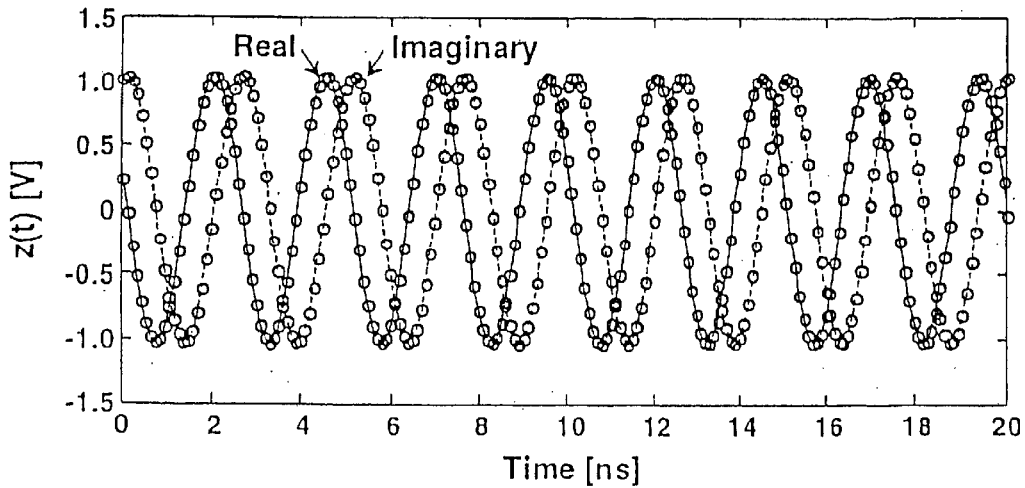

PRIOR ART

PRIOR ART

JITTER MEASUREMENT APPARATUS AND ITS METHOD

BACKGROUND OF THE INVENTION

The present invention relates to a jitter measurement apparatus and a jitter measurement method.

A Time Interval Analyzer or an oscilloscope has conventionally been used in a period jitter measurement. Each of those methods is called a Zero-crossing Method. As shown in FIG. 1, for example, a clock signal (a signal under measurement) x(t) from a PLL (Phase-Locked Loop) under test 11 is supplied to a time interval analyzer 12. Regarding a signal under measurement x(t), a next rising edge following one rising edge fluctuates against the preceding rising edge as indicated by dotted lines. That is, a time interval $T_p$ between two rising edges, namely a period fluctuates. In the Zero-crossing Method, a time interval between zero-crossings (period) is measured, a fluctuation of period is measured by a histogram analysis, and its histogram is displayed as shown in FIG. 2. A time interval analyzer is described in, for example, "Phase Digitizing Sharpens Timing Measurements" by D. Chu, IEEE Spectrum, pp.28–32, 1988 and "A method of Serial Data Jitter Analysis Using One-Shot Time Interval Measurements" by J. Wilstrup, Proceedings of IEEE International Test Conference, pp.819–823, 1998.

In addition, Tektronix Inc. and LeCroy Co. have recently been providing digital oscilloscopes each being able to measure a jitter using an interpolation method. In this jitter measurement method using the interpolation method (interpolation-based jitter measurement method), an interval between data having signal values close to a zero-crossing out of measured data of a sampled signal under measurement is interpolated to estimate a timing of zero-crossing. That is, a time interval between zero-crossings period) is estimated by a data-interpolation with a small error to measure a relative fluctuation of period.

That is, as shown in FIG. 3, a signal under measurement x(t) from the PLL under test 11 is inputted to a digital oscilloscope 14. In the digital oscilloscope 14, as shown in FIG. 4, the inputted signal under measurement x(t) is converted into a digital data sequence by an analog-digital converter 15. A data-interpolation is applied to an interval between data having signal values close to a zero-crossing in the digital data sequence by an interpolator 16. With respect to the data-interpolated digital data sequence, a time interval between zero-crossings is measured by a period estimator 17. A histogram of the measured values is displayed by a histogram estimator 18, and a root-mean-square value and a peak-to-peak value of fluctuations of the measured time intervals are obtained by an RMS & Peak-to-Peak Detector 19. For example, in the case in which a signal under measurement x(t) has a waveform shown in FIG. 5A, its period jitters are measured as shown in FIG. 5B.

On the contrary, we have proposed the $\Delta\phi$ method for measuring a jitter by obtaining a variable component (phase noise) of an instantaneous phase of a signal under measurement. This $\Delta\phi$ method is characterized in that an instantaneous phase of a signal under measurement is estimated using an analytic signal theory. FIG. 6 shows a processing block diagram of the $\Delta\phi$ method. An input signal is transformed into a complex analytic signal by a Hilbert pair generator 21. An instantaneous phase of an input signal is obtained from the complex analytic signal by an instantaneous phase estimator 22. A linear phase component is removed from the instantaneous phase by a linear trend remover 23 to extract a phase noise. With respect to this phase noise, a sample value closest to a zero-crossing point in a real part of the complex analytic signal is extracted by a zero-crossing resampler 24 to obtain a timing jitter sequence. A peak-to-peak value of the output of the zero-crossing resampler 24 is obtained by a $\Delta\phi_{PP}$ detector 25 as a peak-to-peak jitter $\Delta\phi_{PP}$ of the input signal. In addition, a root-mean-square value of the output of the zero-crossing resampler 24 is obtained by a $\Delta\phi_{RMS}$ detector 26 as a root-mean-square value $\Delta\phi_{RMS}$ of jitter of the input signal. Furthermore, a histogram of each sample value of the resampler 24 is displayed and estimated by a histogram estimator 27. This $\Delta\phi$ method is described in, for example, "Extraction of Peak-to-Peak and RMS Sinusoidal Jitter Using an Analytic Signal Method" by T. J. Yamaguchi M. Soma, M. Ishida, T. Watanabe, and T. Ohmi, Proceedings of 18th IEEE VLSI Test Symposium, pp. 395–402, 2000.

In the jitter measurement method by the time interval analyzer method, a time interval between zero-crossings is measured. Therefore a correct measurement can be performed. However, since there is, in this jitter measurement method, a dead-time when no measurement can be performed after one period measurement, there is a problem that it takes a long time to acquire a number of data that are required for a histogram analysis. In addition, in an interpolation-based jitter measurement method in which a wide-band oscilloscope and an interpolation method are combined, there is a problem that a jitter histogram cannot correctly be estimated and a jitter is overestimated (overestimation). That is, there is no compatibility in measured jitter values between this jitter measurement method and the time interval analyzer method. For example, a measured result of jitter measured by a time interval analyzer for a clock signal of 400 MHz is shown in FIG. 7A, and a measured result of jitter measured by an interpolation-based jitter measurement method for the same clock signal is shown in FIG. 7B.

Those measured results are, a measured value by the time interval analyzer 7.72 ps (RMS) vs. a measured value by the interpolation-based jitter measurement method 8.47 ps (RMS), and the latter is larger, i.e., the measured value by interpolation-based jitter measurement method has overestimated the jitter value. In addition, the interpolation-based jitter measurement method cannot correctly estimate a Gaussian distribution having single peak.

It is an object of the present invention to provide a jitter measurement apparatus and its method that can estimate a jitter value having compatibility, similarly to the $\Delta\phi$ method, with a conventional time interval analyzer method, i.e., a correct jitter value in a shorter time period.

SUMMARY OF THE INVENTION

The jitter measurement apparatus according to the present invention comprises: analytic signal transformation means for transforming a signal under measurement into a complex analytic signal; instantaneous phase estimation means for obtaining an instantaneous phase of the signal under measurement from the complex analytic signal transformed by the analytic signal transformation means; zero-crossing timing estimation means for obtaining a zero-crossing timing sequence of the signal under measurement from the estimated instantaneous phase; period estimation means for obtaining an instantaneous period sequence of the signal under measurement from the zero-crossing timing sequence estimated by the zero-crossing timing estimation means;

jitter detection means to which the instantaneous period sequence is inputted for obtaining a jitter of the signal under measurement.

In addition, it is desirable that the jitter measurement apparatus further comprises cycle-to-cycle period jitter estimation means to which the instantaneous period sequence is inputted for calculating its differential sequence and for outputting a cycle-to-cycle period jitter sequence to supply it to the jitter detection means.

In addition, it is desirable that the zero-crossing timing estimation means comprises: instantaneous phase data interpolation means to which the instantaneous phase data are supplied for interpolating instantaneous phase data between a plurality of instantaneous phase data around a predetermined phase value in the instantaneous phase data; zero-crossing data determination means for determining a data closest to the predetermined value in the data-interpolated instantaneous phase data, and timing estimation means for estimating a timing of the determined data.

In addition, it is desirable that, in the jitter measurement apparatus, the zero-crossing timing estimation means is means to which the instantaneous phase data are supplied for estimating a zero-crossing timing sequence by an inverse interpolation method from a plurality of instantaneous phase data around a predetermined phase value in the instantaneous phase data to output the zero-crossing timing sequence.

In addition, it is desirable that the analytic signal transformation means comprises: band-pass filtering means to which the signal under measurement is supplied for extracting only components around a fundamental frequency from the signal under measurement to limit the bandwidth of the signal under measurement; and Hilbert transformation means for Hilbert-transforming an output signal of the band-pass filtering means to generate a Hilbert pair of the input signal.

In addition, it is desirable that the analytic signal transformation means comprises: time domain to frequency domain transformation means to which the signal under measurement is supplied for transforming the signal under measurement into a both-sided spectrum signal in frequency domain; bandwidth limiting means for extracting only components around a positive fundamental frequency in the both-sided spectrum signal; and frequency domain to time domain transformation means for inverse-transforming an output of the bandwidth limiting means into a signal in time domain.

In addition, it is desirable that the analytic signal transformation means comprises: a buffer memory to which the signal under measurement is supplied for storing therein the signal under measurement; means for taking out the signal in the sequential order from the buffer memory such that the signal being taken out is partially overlapped with the signal taken out just before; means for multiplying each taken out partial signal by a window function; means for transforming each partial signal multiplied by the window function into a both-sided spectrum signal in frequency domain; bandwidth limiting means for extracting only components around a positive fundamental frequency of the signal under measurement from the both-sided spectrum signal transformed in frequency domain; means for inverse-transforming an output of the bandwidth limiting means into a signal in time domain; and means for multiplying the signal transformed in time domain by an inverse number of the window function to obtain a band-limited analytic signal.

In addition, it is desirable that the jitter measurement apparatus further comprises AD conversion means to which the signal under measurement is inputted for digitizing and converting an analog signal into a digital signal to input the digital signal to the analytic signal transformation means.

In addition, it is desirable that the jitter measurement apparatus further comprises waveform clipping means to which the signal under measurement is inputted for removing amplitude modulation components of the signal under measurement and for extracting only phase modulation components of the signal under measurement to supply a signal without amplitude modulation components to the analytic signal transformation means.

In addition, it is desirable that the jitter detection means is peak-to-peak detection means for obtaining a difference between the maximum value and the minimum value of a supplied sequence.

In addition, it is desirable that the jitter detection means is RMS detection means for obtaining a root mean square value (RMS value) of a supplied sequence.

In addition, it is desirable that the jitter detection means is histogram estimation means for obtaining a histogram of a supplied sequence.

A jitter measurement method according to the present invention has the steps of: transforming a signal under measurement into a complex analytic signal; estimating an instantaneous phase of the signal under measurement from the complex analytic signal; estimating a zero-crossing timing sequence of the signal under measurement from the instantaneous phase; estimating an instantaneous period sequence of the signal under measurement from the zero-crossing timing sequence; and obtaining a jitter of the signal under measurement from the instantaneous period sequence.

In addition, it is desirable that the jitter measurement method has the step of providing the instantaneous period sequence as an input for calculating its differential sequence and for outputting a cycle-to-cycle period jitter sequence of the signal under measurement.

In addition, it is desirable that the step of estimating a zero-crossing timing sequence comprises the steps of: interpolating instantaneous phase data between a plurality of instantaneous phase data around a predetermined phase value in the instantaneous phase data; determining a data closest to the predetermined phase value in the data-interpolated instantaneous phase data; and estimating a timing of the determined data.

It is desirable that a polynomial interpolation method is used in the step of interpolating.

In addition, it is desirable that a cubic spline interpolation method is used in the step of interpolating to interpolate the waveform data around a zero-crossing.

In addition, it is desirable that the step of estimating a zero-crossing timing sequence is a step of estimating a zero-crossing timing sequence by an inverse interpolation method from a plurality of instantaneous phase data around predetermined phase values in the instantaneous phase data. It is desirable that the inverse interpolation method is an inverse linear interpolation method.

In addition, it is desirable that the step of transforming the signal under measurement into an analytic signal comprises the steps of: extracting only components around a fundamental frequency from the signal under measurement to limit the bandwidth of the signal under measurement; and Hilbert-transforming the band-limited signal to generate a Hilbert pair of the input signal.

In addition, it is desirable that the step of transforming the signal under measurement into an analytic signal comprises the steps of transforming the signal under measurement into a both-sided spectrum signal in frequency domain; extracting only components around a positive fundamental frequency in the both-sided spectrum signal; and inverse-transforming the extracted components around the fundamental frequency into a signal in time domain.

In addition, it is desirable that the step of transforming the signal under measurement into an analytic signal comprises the steps of storing the signal under measurement in a buffer memory; taking out the signal in the sequential order from the buffer memory such that the signal being taken out is partially overlapped with the signal taken out just before; multiplying each taken out partial signal by a window function; transforming each partial signal multiplied by the window function into a both-sided spectrum signal in frequency domain; extracting only components around a positive fundamental frequency of the signal under measurement from the both-sided spectrum signal transformed in frequency domain; inverse-transforming the extracted spectrum signal having components around the fundamental frequency into a signal in time domain; and multiplying the signal transformed in time domain by an inverse number of the window function to obtain a band-limited analytic signal.

In addition, it is desirable that the jitter measurement method has a step of performing a waveform-clipping of the signal under measurement to remove amplitude components of the signal under measurement and to extract only phase modulation components of the signal under measurement and for transferring a signal without amplitude modulation components to the step of transforming the signal under measurement into an analytic signal.

In addition, it is desirable that the step of obtaining a jitter is a step of obtaining a difference between the maximum value and the minimum value of the instantaneous period sequence to calculate a peak-to-peak value.

In addition, it is desirable that the step of obtaining a jitter is a step of obtaining a standard deviation of the instantaneous period sequence to calculate an RMS value.

In addition, it is desirable that the step of obtaining a jitter is a step of obtaining a histogram data of the instantaneous period sequence.

In addition, it is desirable that the step of obtaining a jitter is a step of obtaining a difference between the maximum value and the minimum value of the cycle-to-cycle period jitter sequence to calculate a peak-to-peak value.

In addition, it is desirable that the step of obtaining a jitter is a step of obtaining a root mean square value of the cycle-to-cycle period jitter sequence to calculate an RMS value.

In addition, it is desirable that the step of obtaining a jitter is a step of obtaining a histogram data of the cycle-to-cycle period jitter sequence.

In addition, it is desirable that the step of obtaining a jitter is a step of obtaining a part or all of the peak-to-peak values, RMS values, and histogram data.

The principles of the present invention will be described below. In the description, a clock signal is used as a signal under measurement.

JITTER MEASUREMENT METHOD

A jitter-free clock signal is a square wave having a fundamental frequency $f_0$. This signal can be resolved by Fourier analysis into harmonics comprising frequencies $f_0$, $3f_0$, $5f_0$, ... Since a jitter corresponds to a fluctuation of a fundamental frequency of a signal under measurement, only signal components around the fundamental frequency are handled in a jitter analysis.

A fundamental sinusoidal wave component of a jittery clock signal (signal under measurement) can be expressed by an equation (1) when its amplitude value is A and its fundamental frequency is $f_0$.

$$A\cos(\phi(t)) = A\cos(2\pi f_0 t + \theta - \Delta\phi(t)) \qquad (1)$$

That is, the $\phi(t)$ is an instantaneous phase function of the signal under measurement, and can be expressed by a sum of a linear instantaneous phase component $2\pi f_0 t$ containing a fundamental frequency $f_0$, an initial phase component $\theta$ (can be assumed to be zero in a calculation), and a phase modulation component $\Delta\phi(t)$.

A zero-crossing point of a signal under measurement (a timing when a fundamental sinusoidal wave signal crosses a zero level) can be obtained as a timing when an instantaneous phase $\phi(t)$ becomes $\pi/2 + 2n\pi$ or $3\pi/2 + 2n\pi$ (n=0, 1, 2, ...). Here, a timing point when an instantaneous phase $\phi(t)$ becomes $\pi/2 + 2n\pi$ corresponds to a falling zero-crossing point of the signal under measurement, and a timing point when an instantaneous phase $\phi(t)$ becomes $3\pi/2 + 2n\pi$ corresponds to a rising zero-crossing point of the signal under measurement.

Therefore, by estimating an instantaneous phase $\phi(t)$ of a signal under measurement, by obtaining a zero-crossing timing when the instantaneous phase $\phi(t)$ becomes $\pi/2 + 2n\pi$ or $3\pi/2 + 2n\pi$ (n=0, 1, 2, ...), and then by obtaining a time interval between two zero-crossings, an instantaneous period of the signal under measurement can be obtained. In addition, from the obtained instantaneous period, a period jitter corresponding to a period fluctuation and a cycle-to-cycle period jitter corresponding to a fluctuation between adjacent periods can be obtained. Moreover, by estimating a timing of a zero-crossing point using the interpolation method with a small error, the measurement errors of a timing jitter and a cycle-to-cycle period jitter can be reduced.

In the jitter measurement method according to the present invention, an instantaneous phase $\phi(t)$ of a signal under measurement x(t) shown in FIG. 8 is first estimated. FIG. 9 shows a waveform of the estimated instantaneous phase $\phi(t)$. Next a timing when the instantaneous phase $\phi(t)$ of the signal under measurement becomes $\pi/2 + 2n\pi$ or $3\pi/2 + 2n\pi$ (n=0, 1, 2, ...) is estimated using the interpolation method or the inverse interpolation method, and then a time interval (instantaneous period) T between two zero-crossings is measured. Here, the period is assumed to be n periods (n=0, 1, 2, ...). FIG. 10 shows an instantaneous period waveform T[n] measured when n=1. Finally an RMS value and a peak-to-peak value of period jitters are measured from the instantaneous period sequence T[n]. A period jitter J is a relative fluctuation of a period T against a fundamental period $T_0$, and is expressed by an equation (2).

$$T = T_0 + J \qquad (2)$$

Therefore, an RMS period jitter $J_{RMS}$ corresponds to a standard deviation of the instantaneous period T[n], and is given by an equation (3).

$$J_{RMS} = \sqrt{(1/N)\Sigma_{k=1}^{N}(T[k] - T_M)^2} \qquad (3)$$

In this case, N is the number of samples of the measured instantaneous period data, $T_M$ is a mean value of the instantaneous period data. In addition, a peak-to-peak period jitter $J_{PP}$ is a difference between the maximum value and the minimum value of the T[n], and is expressed by the equation (4).

$$J_{PP}=\max_k(T[k])-\min_k(T[k]) \quad (4)$$

FIG. 11 shows a histogram (FIG. 11C) of the period jitters measured by the jitter measurement method according to the present invention, a histogram (FIG. 11A) measured by the conventional time interval analyzer, and a histogram (FIG. 11B) measured by the Δφ method so that the histogram of the present invention can be compared with the histograms of the conventional time interval analyzer and the Δφ method. The 0 point on the lateral axis in each of FIGS. 11B and 11C corresponds to a period of approximately 2485 (ps), and FIGS. 11B and 11C show difference values obtained by the equation (2) based on the period of approximately 2485 (ps) as a reference value. It can be seen that the histogram of FIG. 11C looks like the histogram of FIG. 11A. In addition, FIG. 12 shows an RMS value and a peak-to-peak value of the period jitter measured by the jitter measurement method according to the present invention so that these values of the present invention can be compared with the corresponding values measured by the time interval analyzer and the Δφ method, respectively. Here, the peak-to-peak value $J_{PP}$ of the observed period jitter is substantially proportional to a square root of logarithm of the number of events (the number of zero-crossings). For example, in the case of approximately 5000 events, $J_{PP}=45$ ps is a correct value. A $J_{PP}$ error in FIG. 12 is shown assuming that 45 ps is the correct value. As shown in FIG. 12, the measured values in the method of the present invention correspond to −3.1% in JRM, and +1.0% in $J_{PP}$ of the respective values measured by the time analyzer, and it can be seen that respective differences are small. As shown in FIGS. 11A, 11B, 11C and 12, the jitter measurement method according to the present invention can obtain measured jitter values compatible with the measurement method by the conventional time interval analyzer by which correct measured values can be obtained.

Furthermore, the jitter measurement method according to the present invention can measure a cycle-to-cycle period jitter at the same time with a period jitter. A cycle-to-cycle period jitter $J_{CC}$ is a period fluctuation between contiguous cycles, and is expressed by an equation (5).

$$J_{CC}[k]=T[k+1]-T[k] \quad (5)$$

Therefore, by obtaining differentials between the instantaneous period data measured by the method of the present invention described above to calculate a root-mean-square and a difference between the maximum value and the minimum value of the instantaneous period data, an RMS value $J_{CC,RMS}$ and a peak-to-peak value $J_{CC,PP}$ of cycle-to-cycle period jitter can be obtained by equations (6) and (7), respectively.

$$J_{CC,RMS}=\sqrt{((1/M)\Sigma_{k=1}^{M}J^2_{CC}[k])} \quad (6)$$

$$J_{CC,PP}=\max_k(J_{CC}[k])-\min_k(J_{CC}[k]) \quad (7)$$

In this case, M is the number of samples of the measured cycle-to-cycle period jitter data. FIGS. 13 and 14 show a waveform and a histogram of the obtained cycle-to-cycle period jitter $J_{CC}[n]$, respectively.

In the jitter measurement method according to the present invention, as described above, a tiring (zero-crossing point) when the instantaneous phase becomes $\pi/2+2n\pi$ or $3\pi/2+2n\pi$ (n=0, 1, 2, . . . ) may be estimated to obtain an instantaneous period, or a timing when the instantaneous phase becomes another phase value may be estimated to obtain an instantaneous period.

In addition, in the jitter measurement method according to the present invention, a period jitter can also be estimated with high accuracy by removing, using waveform clipping means, amplitude modulation (AM) components of a signal under measurement to retain only phase modulation (PM) components corresponding to a jitter.

INSTANTANEOUS PHASE ESTIMATION METHOD USING AN ANALYTIC SIGNAL

An analytic signal z(t) of a real signal x(t) is defined by a complex signal expressed by the following equation (8).

$$z(t)=x(t)+jx'(t) \quad (8)$$

In this case, j represents an imaginary unit, and an imaginary part x'(t) of the complex signal z(t) is a Hilbert transformation of a real part x(t).

On the other hand, Hilbert transformation of a time function x(t) is defined by the following equation (9).

$$x'(t) = H[x(t)] = \frac{1}{\pi}\int_{-\infty}^{+\infty} \frac{x(\tau)}{t-\tau} d\tau \quad (9)$$

In this case, x'(t) is a convolution of the function x(t) and (1/πf). That is, Hilbert transformation is equivalent to an output at the time when the x(t) is passed through an entire-band-pass filter. However, the output x'(t) in this case has not been changed in terms of its magnitude of spectrum components, but its phase has been shifted by π/2.

Analytic signal and Hilbert transformation are described in, for example, "Probability, Random Variables, and Stochastic Processes" by A. Papoulis, 2nd edition, McGraw-Hill Book Company, 1984.

An instantaneous phase waveform φ(t) of a real signal x(t) can be obtained from an analytic signal z(t) using the following equation (10).

$$\phi(t)=\tan^{-1}[x'(t)/x(t)] \quad (10)$$

Next, an algorithm for estimating an instantaneous phase using Hilbert transformation will be described. First, a signal under measurement x(t) shown in FIG. 15 is transformed into an analytic signal z(t) by applying Hilbert transformation to the signal under measurement x(t) to obtain a signal x'(t) corresponding to an imaginary part of the complex signal. FIG. 16 shows a transformed analytic signal. A real part x(t) is indicated by a solid line, and an imaginary part x'(t) is indicated by a dashed line. Here, a band-pass filtering process has been applied to the obtained analytic signal. This is because a jitter corresponds to a fluctuation of a fundamental frequency of a signal under measurement and hence only signal components around a fundamental frequency are handled in a jitter analysis. Next, an instantaneous phase function φ(t) is estimated from the obtained analytic signal using the equation (10). Here, φ(t) is expressed using principal values of phase in the range of −π to +π, and has a discontinuity point at the proximity of a point where the phase changes from +π to −π. FIG. 17 shows the estimated instantaneous phase function φ(t). Finally, by unwrapping (that is, an integer multiple of 2π is appropriately added to a principal value φ(t)) the discontinuous instantaneous phase function φ(t), a continuous instantaneous phase function φ(t) from which discontinuity has been removed can be obtained. FIG. 18 shows an unwrapped continuous instantaneous phase function φ(t).

TRANSFORMATION TO AN ANALYTIC SIGNAL USING FAST FOURIER TRANSFORMATION

A transformation from a real signal to an analytic signal can be realized by a digital signal processing using Fast Fourier Transformation.

First, FFT is applied to, for example, a digitized signal under measurement x(t) (400 MHz clock) shown in FIG. 19 to obtain a both-sided spectrum (having positive and negative frequencies) X(f). FIG. 20 shows the obtained both-sided spectrum X(f). Next, data around the fundamental frequency 400 MHz in the positive frequency components of the spectrum X(f) are retained, and the remaining data are made zero. In addition, the positive frequency components are doubled. These processes in frequency domain correspond to limiting bandwidth of the signal under measurement and transforming the signal under measurement into an analytic signal in time domain. FIG. 21 shows the obtained signal Z(f) in frequency domain. Finally, by applying inverse FFT to the obtained signal Z(f), a band-limited analytic signal z(t) can be obtained. FIG. 22 shows the band-limited analytic signal z(t).

Transformation to an analytic signal using FFT is described in, for example, "Random Data: Analysis and Measurement Procedure" by J. S. Bendat and A. G. Piersol, 2nd edition, John Wiley & Sons, Inc., 1986.

TIMING ESTIMATION BY INTERPOLATION METHOD

When values of a function y=f(x) are given for discontinuous values $x_1, x_2, x_3, \ldots, x_n$ of a variable x, "interpolation" is to estimate a value of f(x) for a value of x other than $x_k$ (k=1, 2, 3, ..., n).

In the timing estimation using an interpolation method, for example as shown in FIG. 23, an interval between two measurement points $x_k$ and $x_{k+1}$ that contains a predetermined value $y_c$ is interpolated in sufficient detail. After that an interpolated data closest to the predetermined value $y_c$ is searched, whereby a timing x when a function value y becomes the predetermined value $y_c$ is estimated. A timing estimation error is proportional to a time width that equally divides a time length between two measurement points $x_k$ and $x_{k+1}$. That is, in order to decrease a timing estimation error, it is desirable that y=f(x) is interpolated by dividing a time length between the two measurement points $x_k$ and $x_{k+1}$ into equal time widths and by making each time width as short as possible.

POLYNOMIAL INTERPOLATION

First, an interpolation method using a polynomial will be described. Polynomial interpolation is described in, for example, "Numerical Analysis" by L. W. Johnson and R. D. Riess, Massachusetts: Addison-Wesley, pp. 207–230, 1982.

When two points $(x_1, y_1)$ and $(x_2, y_2)$ on a plane are given, a line $y=P_1(x)$ that passes through these two points is given by an equation (11), and is unitarily determined.

$$y=P_1(x)=\{(x-x_2)/(x_1-x_2)\}y_1+\{(x-x_1)/(x_2-x_1)\}y_2 \quad (11)$$

Similarly, a quadratic curve $y=P_2(x)$ that passes through three points $(x_1, y_1), (x_2, y_2)$ and $(x_3, y_3)$ on a plane is given by an equation (12).

$$y=P_2(x)=\frac{(x-x_2)(x-x_3)}{(x_1-x_2)(x_1-x_3)}y_1+ \\ \frac{(x-x_1)(x-x_3)}{(x_2-x_1)(x_2-x_3)}y_2+\frac{(x-x_1)(x-x_2)}{(x_3-x_1)(x_3-x_2)}y_3 \quad (12)$$

In general, a curve of (N-1)th degree $y=P_{N-1}(x)$ that passes through N points $(x_1, y_1), (x_2, y_2) \ldots (x_N, y_N)$ on a plane is unitarily determined, and is given by an equation (13) from the Lagrange's classical formula.

$$y=P_{N-1}(x)=\frac{(x-x_2)(x-x_3)\ldots(x-x_N)}{(x_1-x_2)(x_1-x_3)\ldots(x_1-x_N)}y_1+ \\ \frac{(x-x_1)(x-x_3)\ldots(x-x_N)}{(x_2-x_1)(x_2-x_3)\ldots(x_2-x_N)}y_2+\ldots+ \\ \frac{(x-x_1)(x-x_2)\ldots(x-x_{N-1})}{(x_N-x_1)(x_N-x_2)\ldots(x_N-x_{N-1})}y_N \quad (13)$$

In the interpolation by polynomial of degree (N-1), a value of y=f(x) for a desired x is estimated from N measurement points using the above equation (13). In order to obtain a better approximation of an interpolation curve $P_{N-1}(x)$, it is desirable to select N points in the proximity of x.

CUBIC SPLINE INTERPOLATION

Next cubic spline interpolation will be described. Cubic spline interpolation is described in, for example, "Numerical Analysis" by L. W. Johnson and R. D. Riess, Massachusetts: Addison-Wesley, pp. 237–248, 1982.

"Spline" means an adjustable ruler (thin elastic rod) used in drafting. When a spline is bended such that the spline passes through predetermined points on a plane, a smooth curve (spline curve) concatenating those points is obtained. This spline curve is a curve that passes through the predetermined points, and has the minimum value of square integral (proportional to the transformation energy of spline) of its curvature.

When two points $(x_1, y_1)$ and $(x_2, y_2)$ on a plane are given, a spline curve that passes through these two points is given by an equation (14).

$$y=Ay_1+By_2+Cy_1''+Dy_2''$$

$$A\equiv(x_2-x)/(x_2-x_1)$$

$$B\equiv 1-A=(x-x_1)/(x_2-x_1) \quad (14)$$

$$C\equiv(\tfrac{1}{6})(A^3-A)(x_2-x_1)^2$$

$$D\equiv(\tfrac{1}{6})(B^3-B)(x_2-x_1)^2$$

Here, $y_1''$ and $y_2''$ are the second derivative values of the function y=f(x) at $(x_1, y_1)$ and $(x_2, y_2)$, respectively.

In the cubic spline interpolation, a value of y=f(x) for a desired x is estimated from two measurement points and the second derivative values at the measurement points using the above equation (14). In order to obtain a better approximation of an interpolation curve, it is desirable to select two points in the proximity of x.

TIMING ESTIMATION BY INVERSE LINEAR INTERPOLATION

Inverse interpolation is a method of conjecturing, when a value of a function $y_k=f(x_k)$ is given for a discontinuous value $x_1, x_2, \ldots, x_n$ of a variable x, a value of g(y)=x for an arbitrary y other than discontinuous $y_k$ (k=1, 2, ..., n) by defining an inverse function of y=f(x) to be x=g(y). In the inverse linear interpolation, a linear interpolation is used in order to conjecture a value of x for y.

When two points $(x_1, y_1)$ and $(x_2, y_2)$ on a plane are given, a linear line that passes through these two points is given by an equation (15).

$$y=\{(x-x_2)/(x_1-x_2)\}y_1+\{(x-x_1)/(x_2-x_1)\}y_2 \quad (15)$$

An inverse function of the above equation is given by an equation (16), and a value of x for y can unitarily be obtained.

$$x=\{(y-y_2)/(y_1-y_2)\}x_1+\{(y-y_1)/(y_2-y_1)\}x_2 \quad (16)$$

In the inverse linear interpolation, as shown in FIG. 24, a value of $x=g(y_c)$ for a desired $y_c$ is estimated from two measurement points $(x_k, y_k)$ and $(x_{k+1}, y_{k+1})$ using the above equation (16), whereby a timing x for obtaining a predetermined value $y_c$ is unitarily be estimated. In order to reduce an estimation error, it is desirable to select two measurement points $x_k$ and $x_{k+1}$ between which x is contained.

WAVEFORM CLIPPING

Waveform clipping means removes AM (amplitude modulation) components from an input signal, and retains only PM (phase modulation) components corresponding to a jitter. Waveform clipping is performed by applying the following processes to an analog input signal or a digital input signal; 1) multiplying the value of the signal by a constant, 2) replacing a signal value larger than a predetermined threshold 1 with the threshold 1, and 3) replacing a signal value smaller than a predetermined threshold 2 with the threshold 2. Here, it is assumed that the threshold 1 is larger than the threshold 2. FIG. 25A shows an example of a clock signal having AM components. Since the envelope of the time based waveform of this signal fluctuates, it is seen that this signal contains AM components. FIG. 25B shows a clock signal that is obtained by clipping the clock signal shown in FIG. 25A using clipping means. Since the time based waveform of this signal shows a constant envelope, it can be ascertained that the AM components have been removed.

BRIEF DESCRIPTION OF THE DRAWINGS

FIG. 12 is a diagram for comparing, with each other, period jitter values respectively measured by the time interval analyzer, the Δϕ method, and the jitter measurement method according to the present invention;

FIG. 20 is a diagram showing an example of a both-sided power spectrum of a signal under measurement obtained by FFT;

FIG. 21 is a diagram showing an example of a band-limited single-sided power spectrum;

FIG. 22 is a diagram showing an example of a band-limited analytic signal obtained using inverse FFT;

DESCRIPTION OF A PREFERRED EMBODIMENT

An embodiment of the present invention will be described below.

Figure 1:
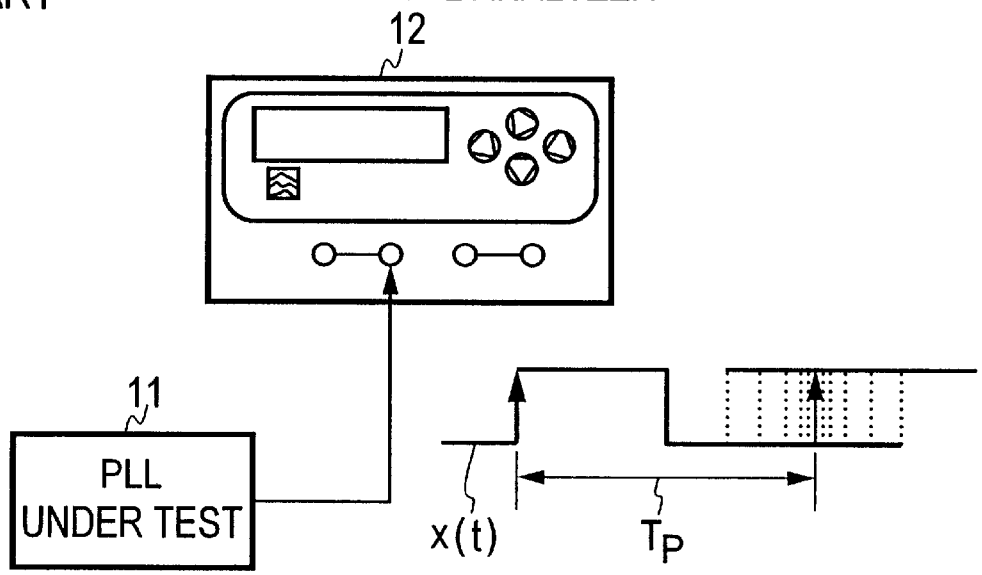
FIG. 1 is a diagram showing a jitter measurement setup using a time interval analyzer.
Figure 2:
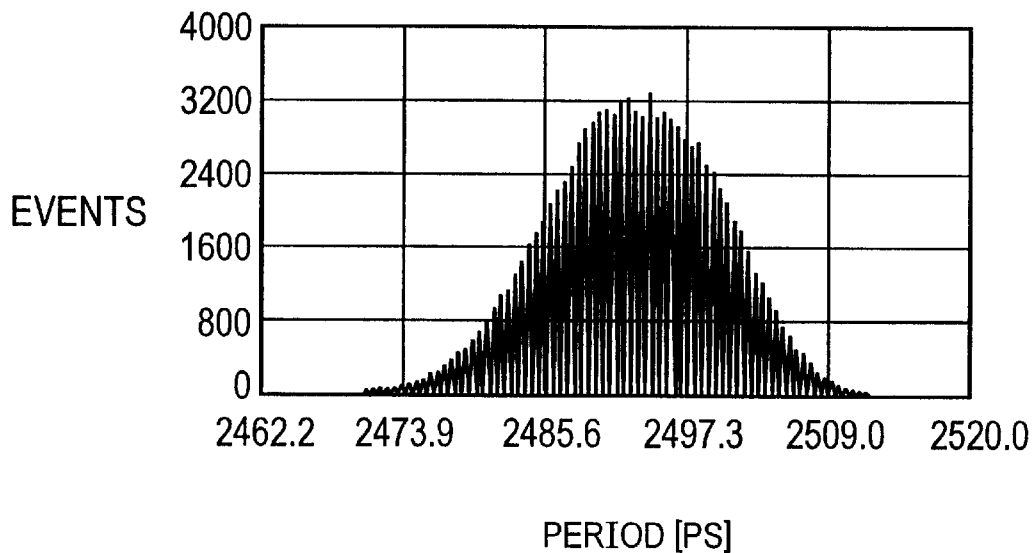
FIG. 2 is a diagram showing an example of a histogram of period jitters measured by the time interval analyzer.
Figure 3:
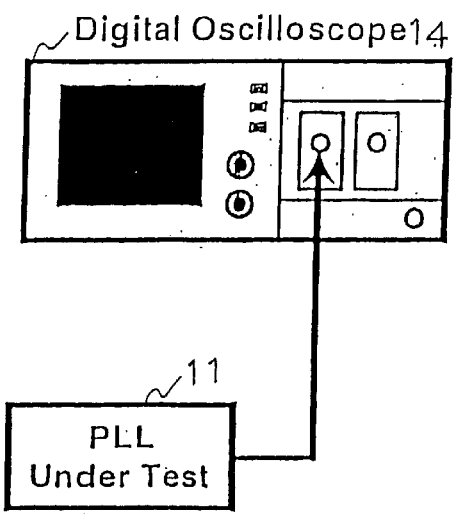
FIG. 3 is a diagram showing a jitter measurement setup using an interpolation-based jitter measurement method (oscilloscope)
Figure 4:
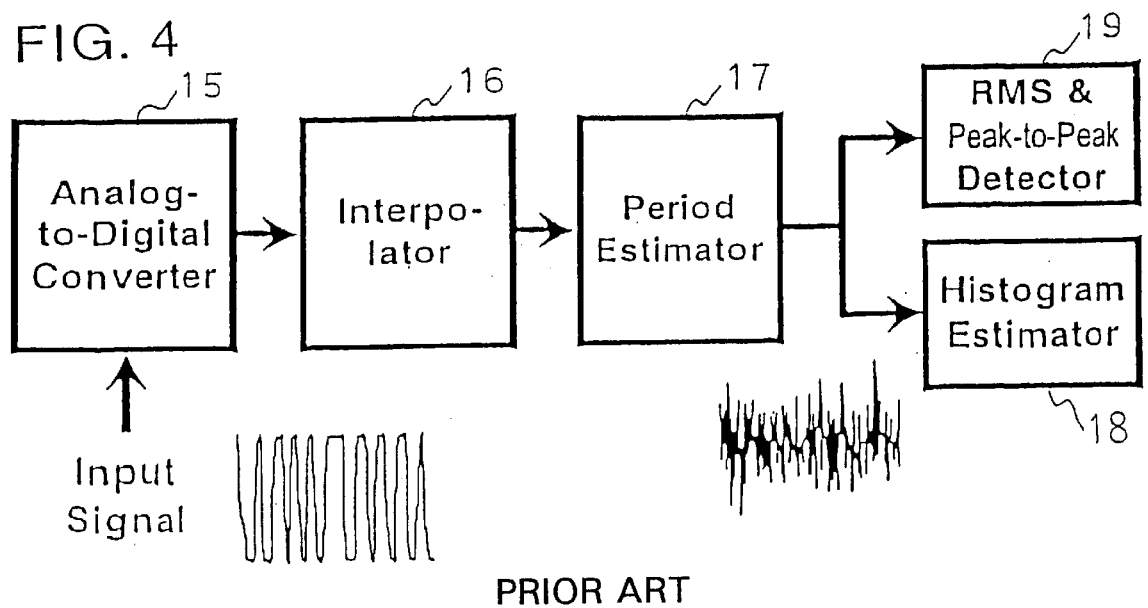
FIG. 4 is a block diagram showing a functional structure of jitter measurement using the interpolation-based jitter measurement method shown in FIG. 3.
Figure 5A:
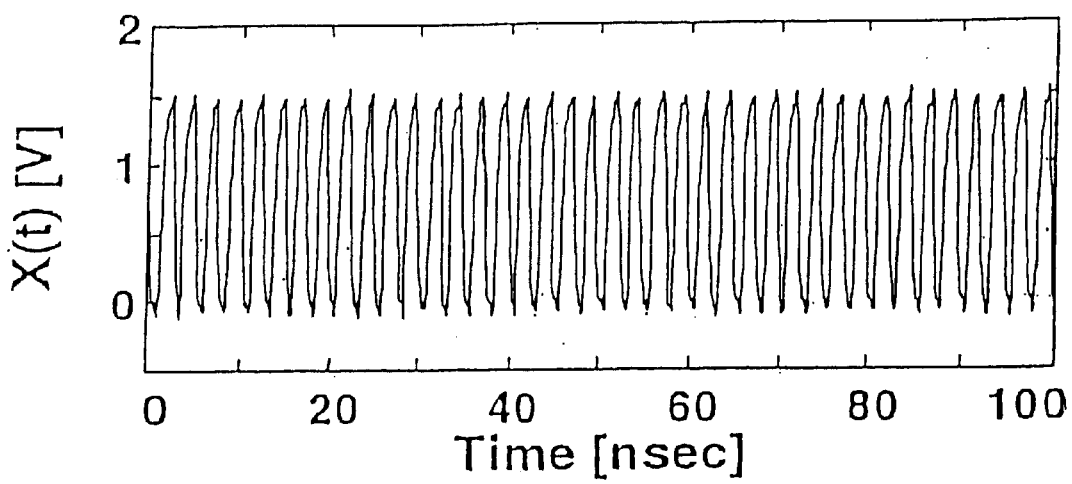
FIG. 5A is a diagram showing a waveform example of a signal under measurement.
Figure 5B:
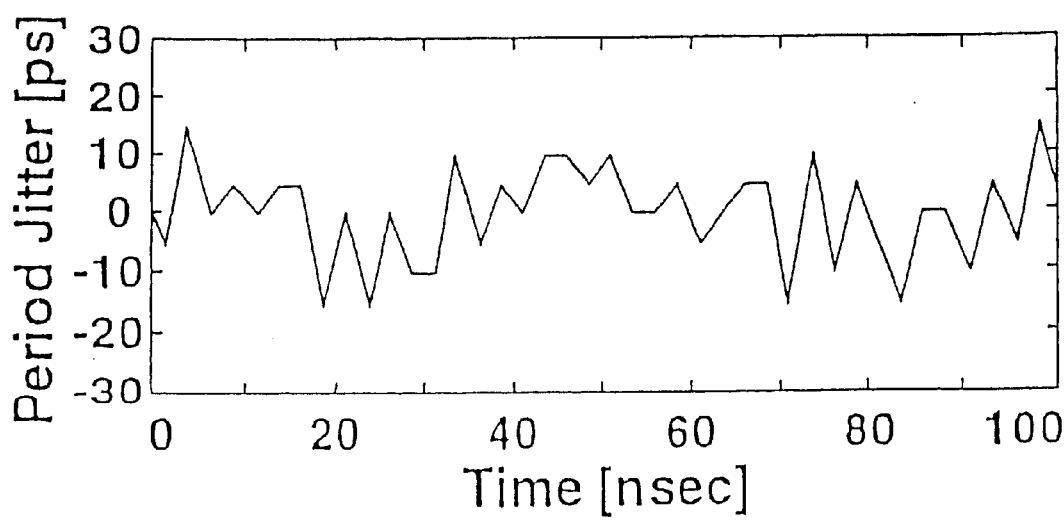
FIG. 5B is a diagram showing a waveform example of measured period jitters.
Figure 6:
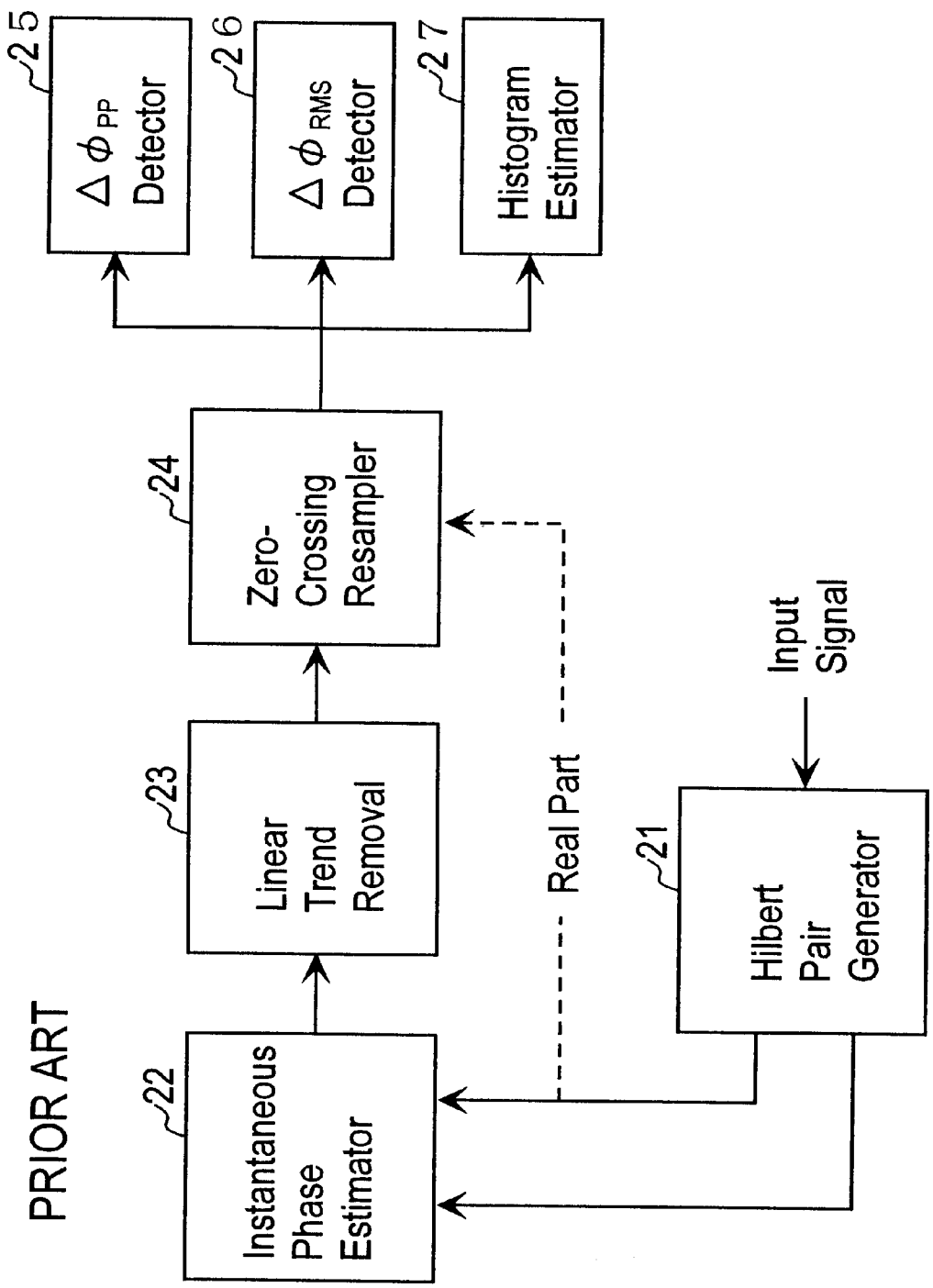
FIG. 6 is a block diagram showing a processing procedure of a conventional Δϕ method.
Figure 7A:
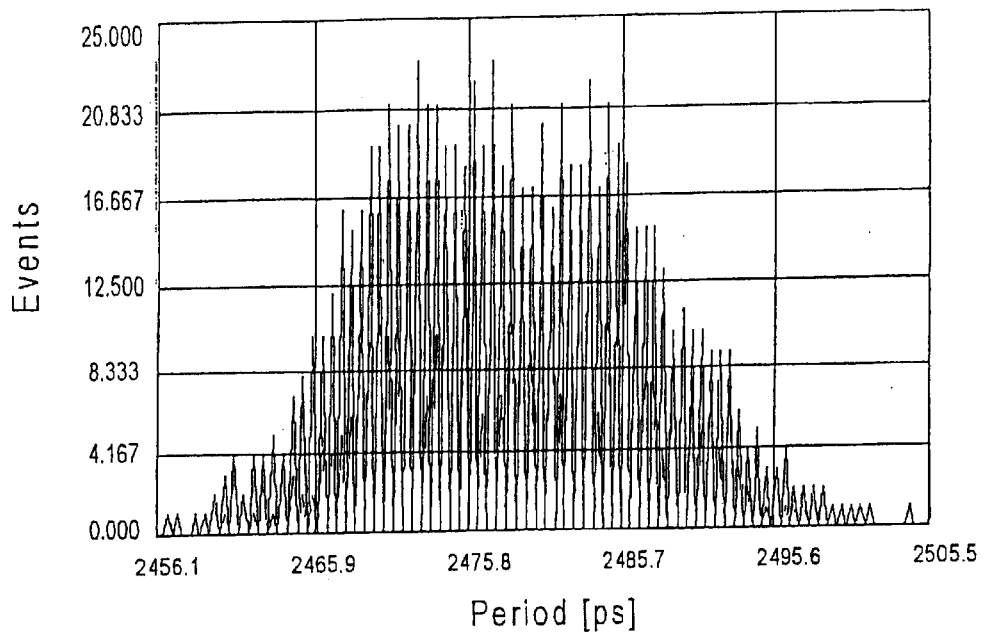
FIG. 7A is a diagram showing an example of measured result of jitters measured by the conventional time interval analyzer.
Figure 7B:
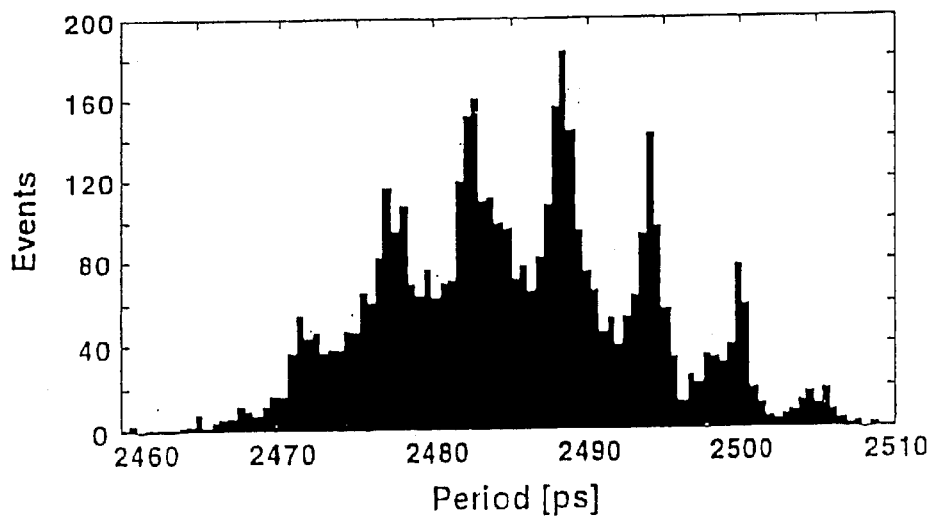
FIG. 7B is a diagram showing an example of measured result of jitters measured by the conventional interpolation-based jitter measurement method.
Figure 8:
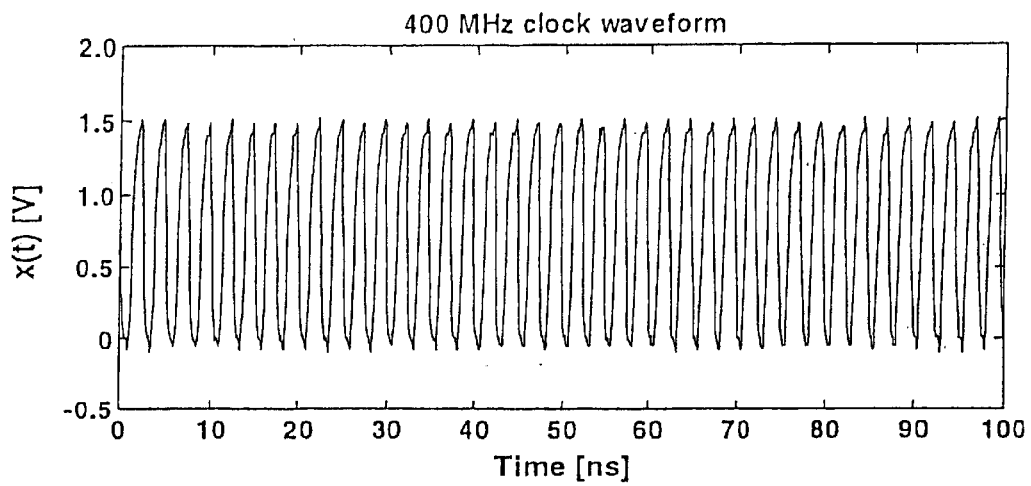
FIG. 8 is a diagram showing a waveform example of a clock signal under measurement.
Figure 9:
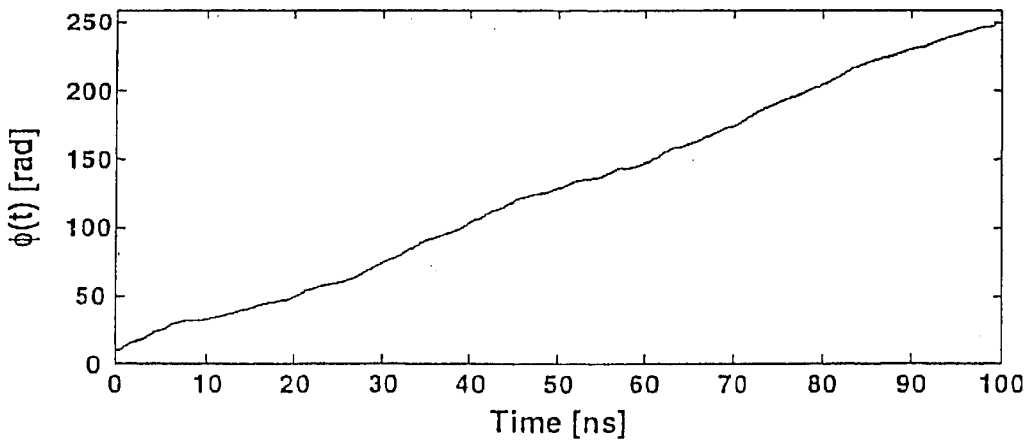
FIG. 9 is a diagram showing an example of an instantaneous phase waveform of a clock signal under measurement.
Figure 10:
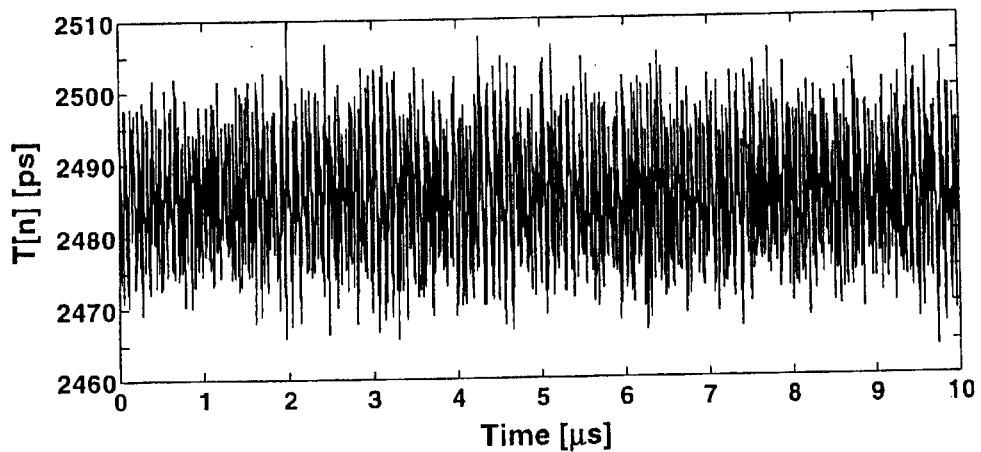
FIG. 10 is a diagram showing an example of an instantaneous period waveform T[n] of a clock signal under measurement.
Figure 13:
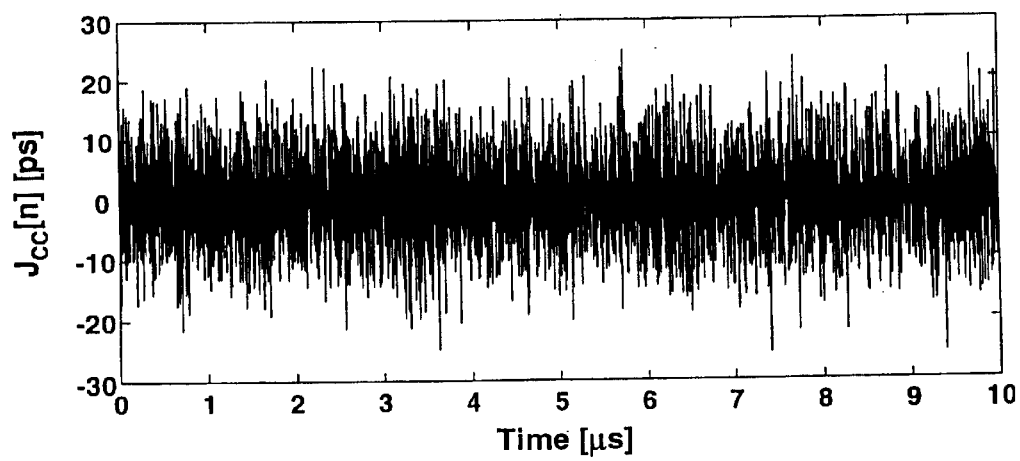
FIG. 13 is a diagram showing an example of a cycle-to-cycle period jitter waveform of a clock signal under measurement measured by the method according to the present invention.
Figure 14:
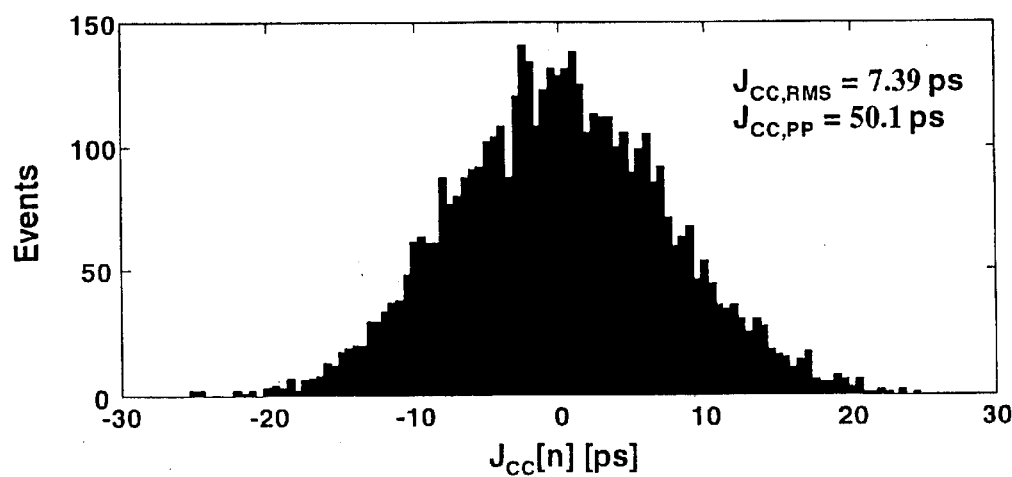
FIG. 14 is a diagram showing an example of a histogram of cycle-to-cycle period jitters measured by the jitter measurement method according to the present invention.
Figure 11:
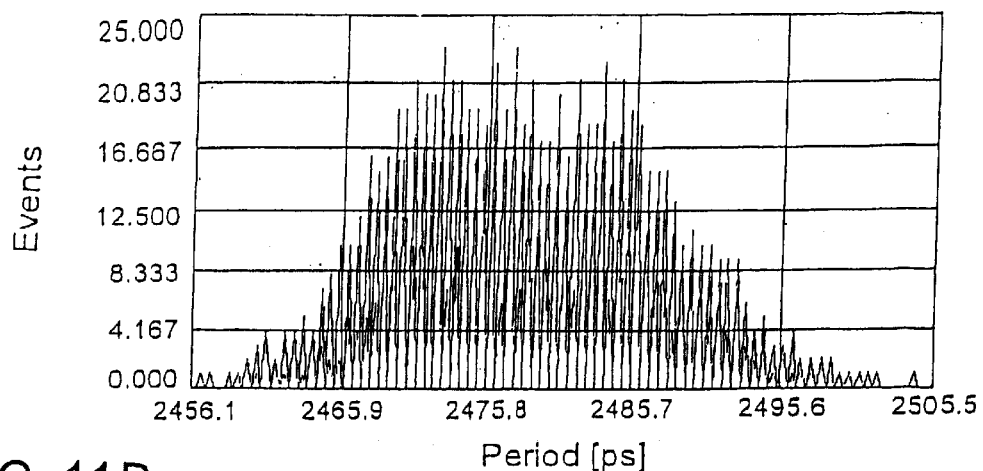
FIG. 11A is a diagram showing an example of a histogram of period jitters measured by the time interval analyzer.
FIG. 11B is a diagram showing an example of a histogram of period jitters measured by the Δϕ method.
FIG. 11C is a diagram showing an example of a histogram of period jitters measured by the jitter measurement method according to the present invention.
Figure 11:
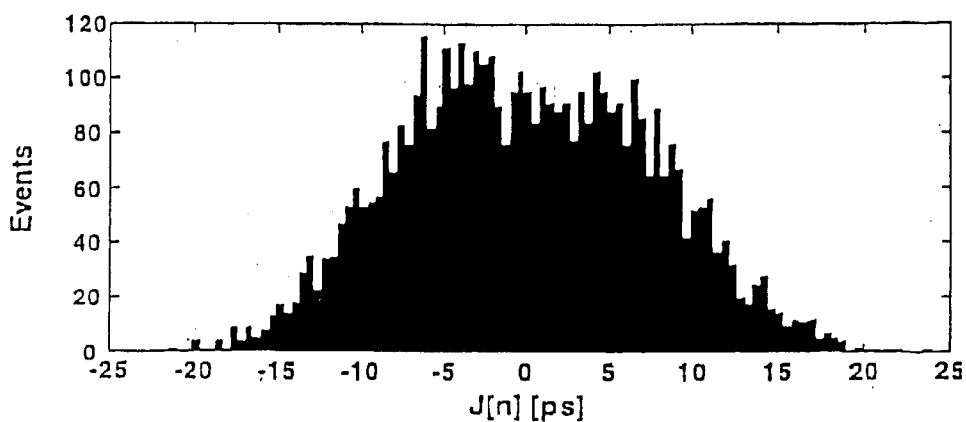
Figure 11:
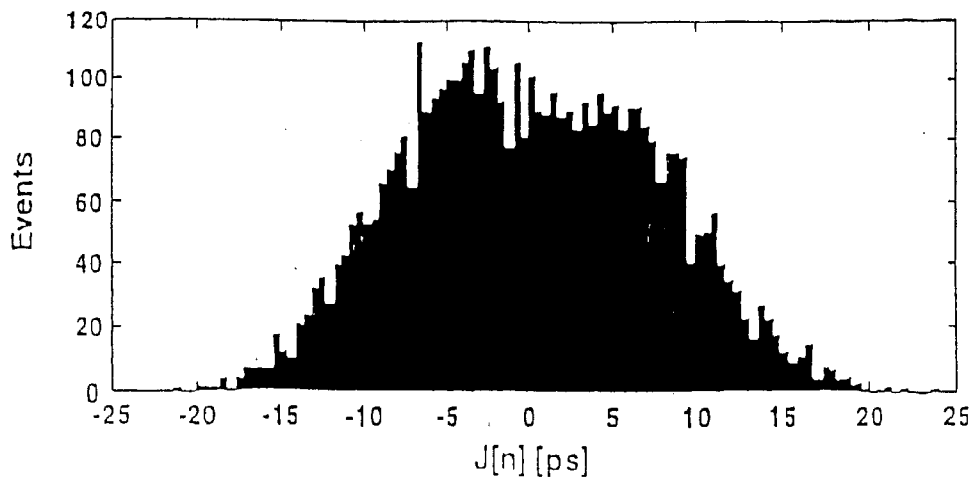
Figure 15:
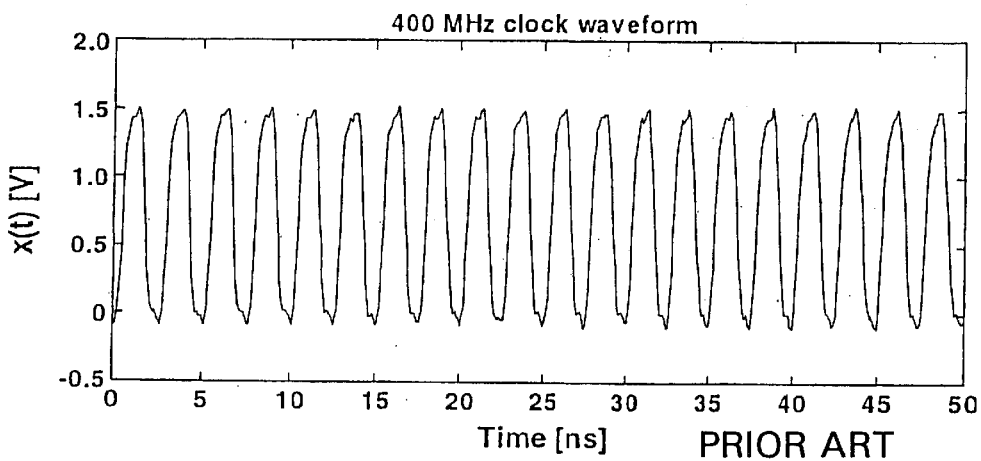
FIG. 15 is a diagram showing an example of a clock signal under measurement.
Figure 16:
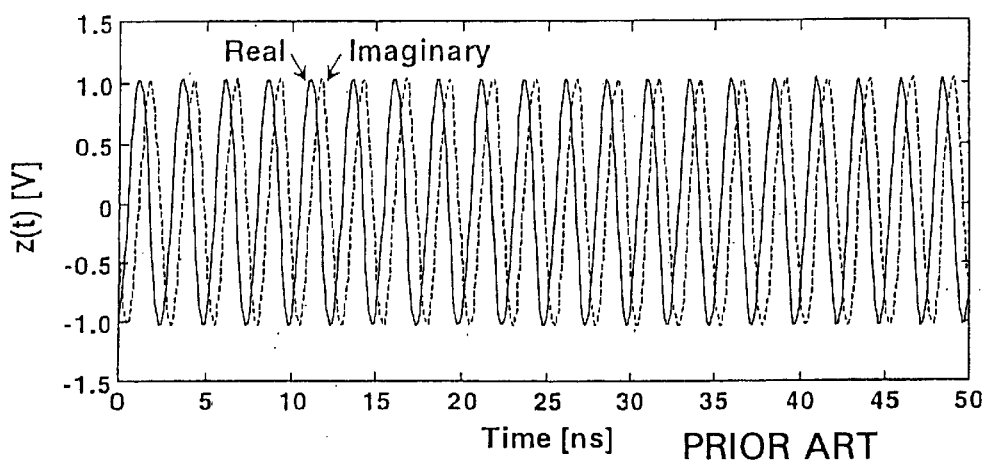
FIG. 16 is a diagram showing an example of a transformed complex analytic signal.
Figure 17:
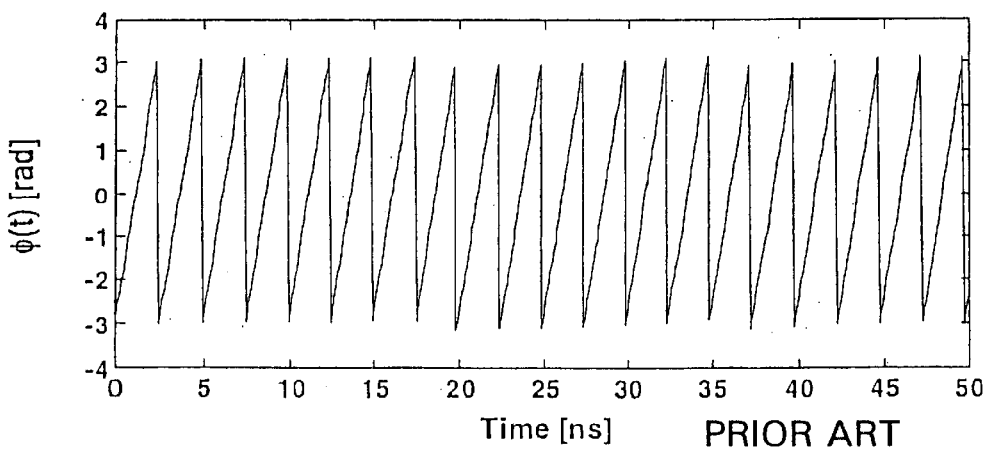
FIG. 17 is a diagram showing an example of an instantaneous phase signal having discontinuity points.
Figure 18:
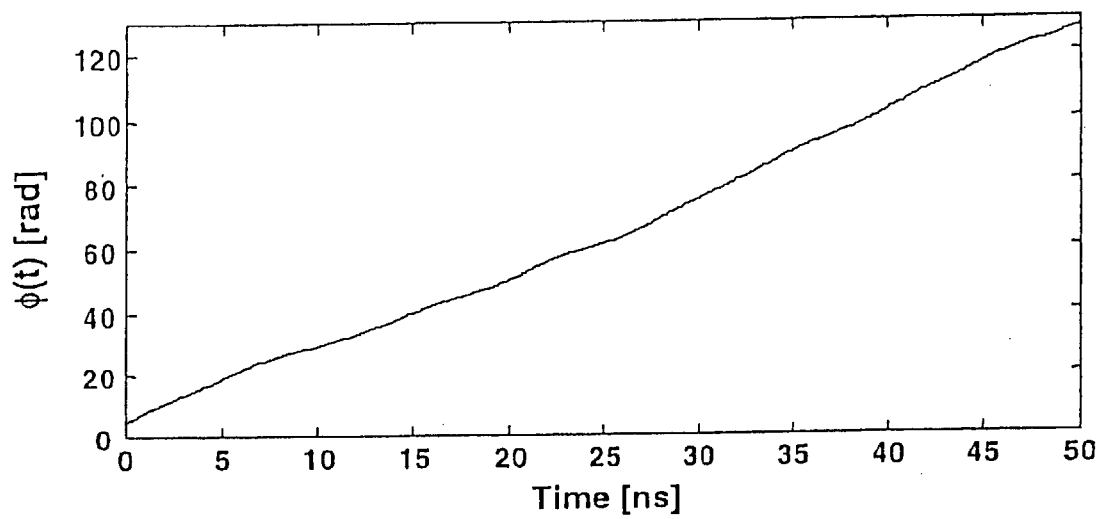
FIG. 18 is a diagram showing an example of an unwrapped continuous instantaneous phase signal.
Figure 19:
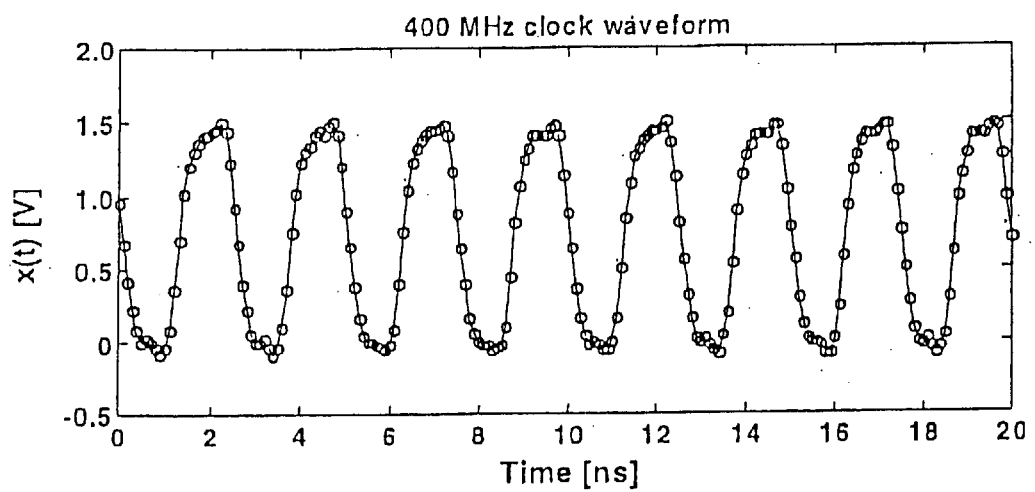
FIG. 19 is a diagram showing an example of a digitized signal under measurement.
Figure 23:
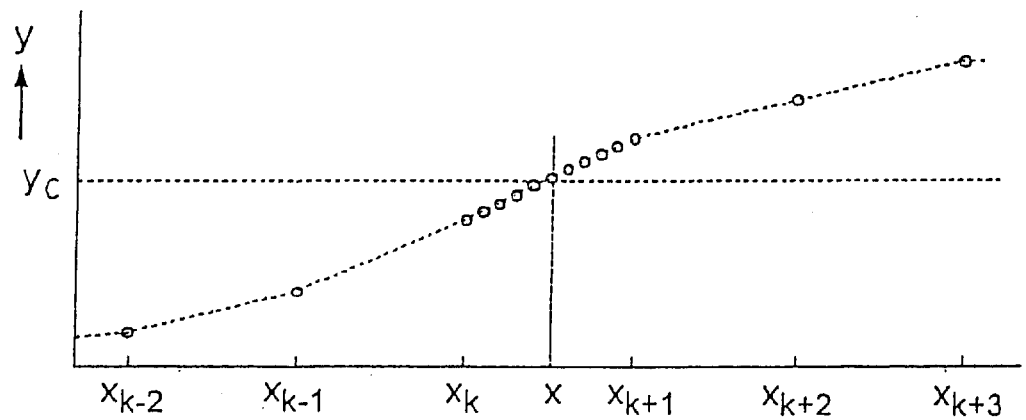
FIG. 23 is a diagram showing an example of a timing estimation using an interpolation method.
Figure 24:
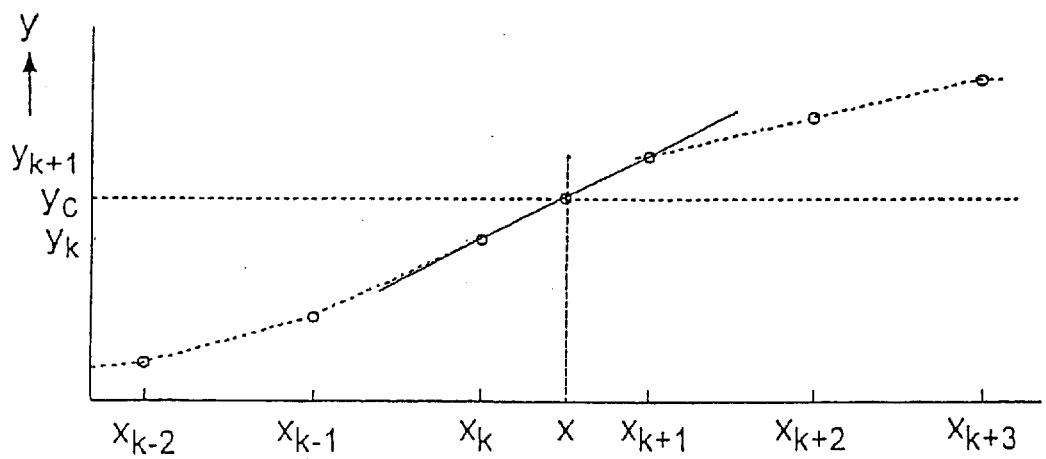
FIG. 24 is a diagram showing an example of a timing estimation using an inverse linear interpolation method.
Figure 25A:
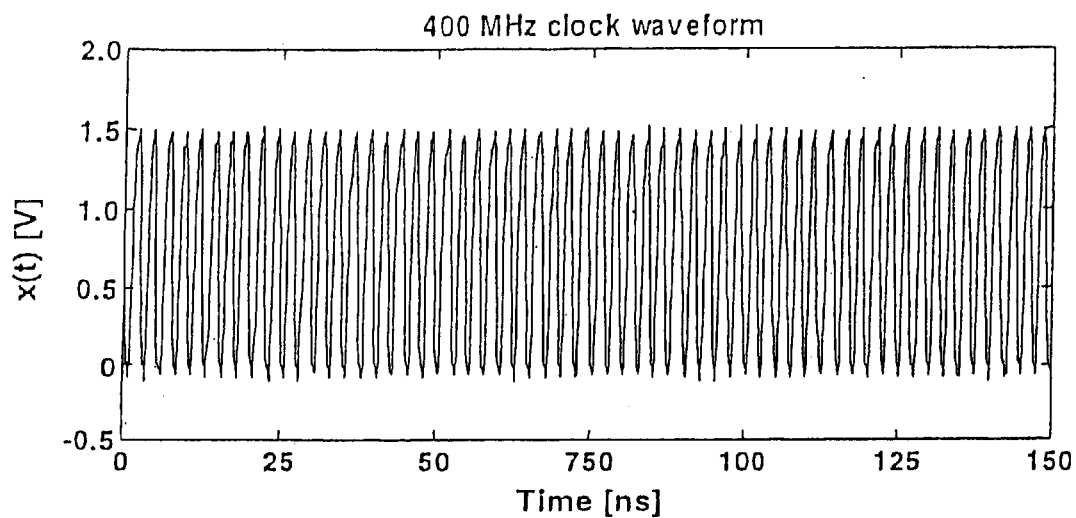
FIG. 25A is a diagram showing an example of a clock signal under measurement that contains AM components.
Figure 25B:
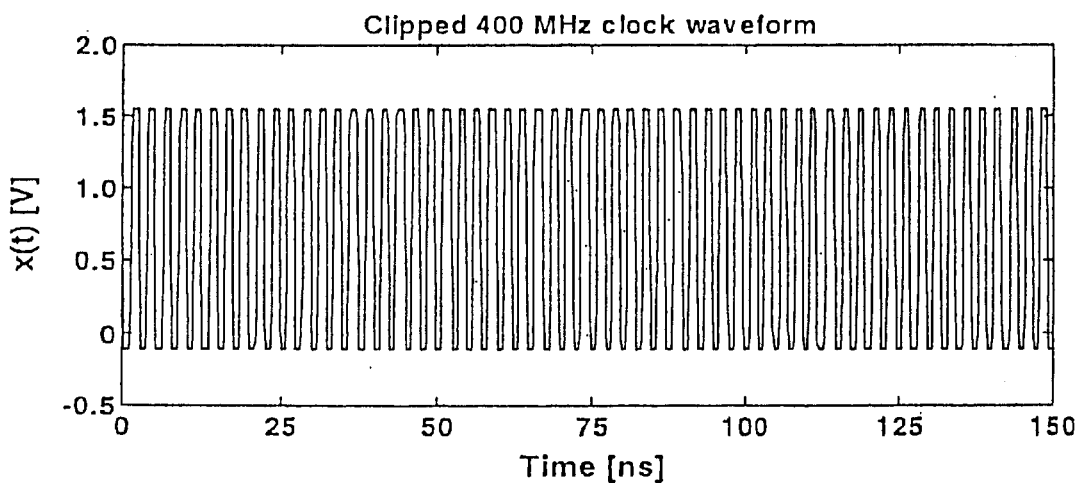
FIG. 25B is a diagram showing an example of a clock signal under measurement that does not contain AM components.
Figure 26:
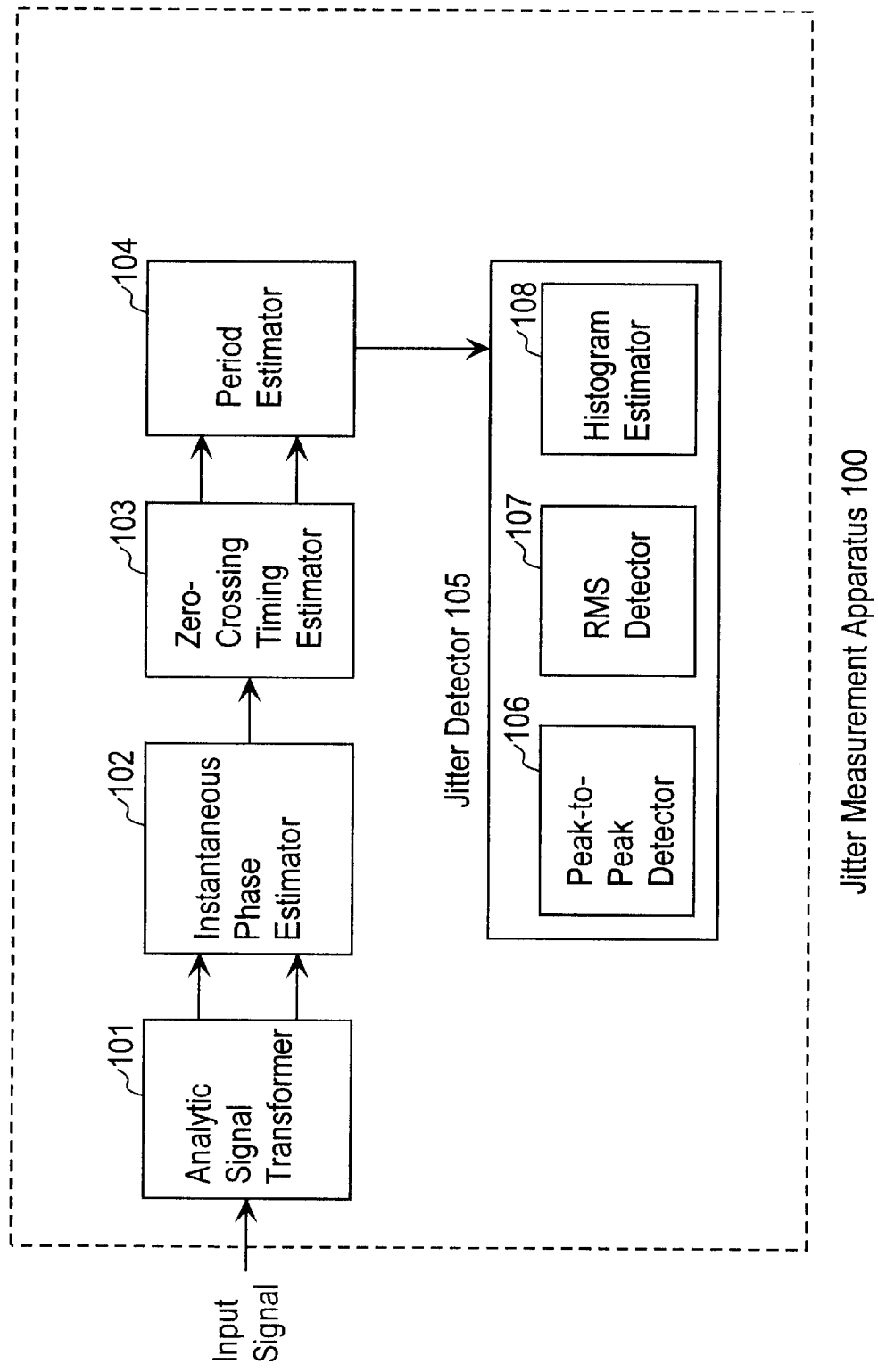
FIG. 26 is a diagram showing an example of a configuration of a jitter measurement apparatus according to the present invention.

FIG. 26 shows an example of a configuration of the jitter measurement apparatus used in the embodiment of the present invention. This jitter measurement apparatus 100 comprises analytic signal transformation means 101 for selectively passing therethrough a predetermined frequency component of a signal under measurement (input signal) to transform it into a complex analytic signal, instantaneous phase estimation means 102 for estimating an instantaneous phase of the signal under measurement using the complex analytic signal obtained from the analytic signal transformation means 101, zero-crossing timing estimation means 103 for estimating a zero-crossing timing sequence of the signal under measurement using the instantaneous phase, period estimation means 104 for obtaining an instantaneous period sequence of the signal under measurement from the zero-crossing timing sequence estimated by the zero-crossing estimation means 103, and jitter detection means 105 for obtaining a jitter of the signal under measurement from the instantaneous period sequence. In addition, the jitter detection means 105 comprises one or a plurality of peak-to-peak detection means 106 for obtaining a difference between the maximum value and the minimum value in the instantaneous period sequence, RMS detection means 107 for obtaining a standard deviation of the instantaneous period sequence to calculate an RMS value, and histogram estimation means 108 for obtaining a histogram of the instantaneous period sequence. Moreover, the analytic signal transformation means 101 can employ either one of the configurations to be described later.

Figure 27:
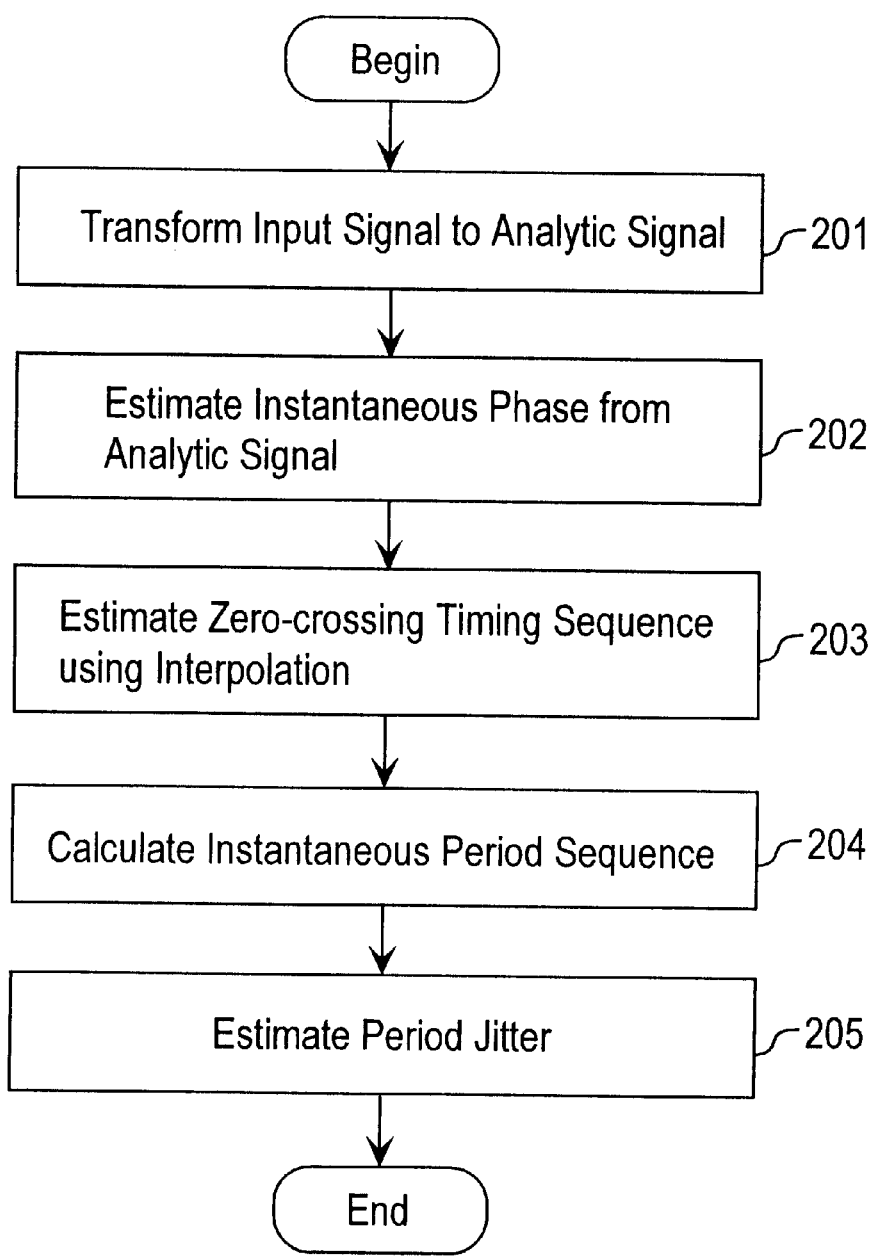
FIG. 27 is a flow-chart showing an example of a jitter measurement method according to the present invention.

Next, the operation in the case of performing a jitter measurement of a signal under measurement using the jitter measurement apparatus 100 according to the present invention will be described. FIG. 27 shows a processing procedure of the jitter measurement method according to the present invention. First, in step 201, the analytic signal transformation means 101 selectively passes therethrough a predetermined frequency component of a digitized signal under measurement to transform it into a complex analytic signal. Next, in step 202, an instantaneous phase of the signal under measurement is estimated by the instantaneous phase estimation means 102 using the complex analytic signal obtained from the analytic signal transformation means 101. Next, in step 203, the zero-crossing timing estimation means 103 estimates a zero-crossing timing sequence of the signal under measurement from the instantaneous phase. Next, in step 204, the period estimation means 104 calculates a time interval between two zero-crossings from the zero-crossing timing sequence estimated by the zero-crossing timing estimation means 103 to estimate an instantaneous period sequence of the signal under measurement. Finally, in step 205, the jitter detection means 105 obtains a period jitter of the signal under measurement from the instantaneous period sequence, and the process ends.

In the step 205 for obtaining a period jitter of the signal under measurement, the peak-to-peak detection means 106 obtains a peak-to-peak value of period jitter using the equation (4), the RMS detection means 107 obtains an RMS value of period jitter using the equation (3), and the histogram estimation means 108 obtains a histogram from the instantaneous period sequence. In addition, in the step 203 for estimating a zero-crossing timing sequence, a timing when the instantaneous phase becomes $\pi/2+2n\pi$ or $3\pi/2+2n\pi$ (n=0, 1, 2, . . . ) is estimated using the interpolation method or the inverse interpolation method.

Figure 28:
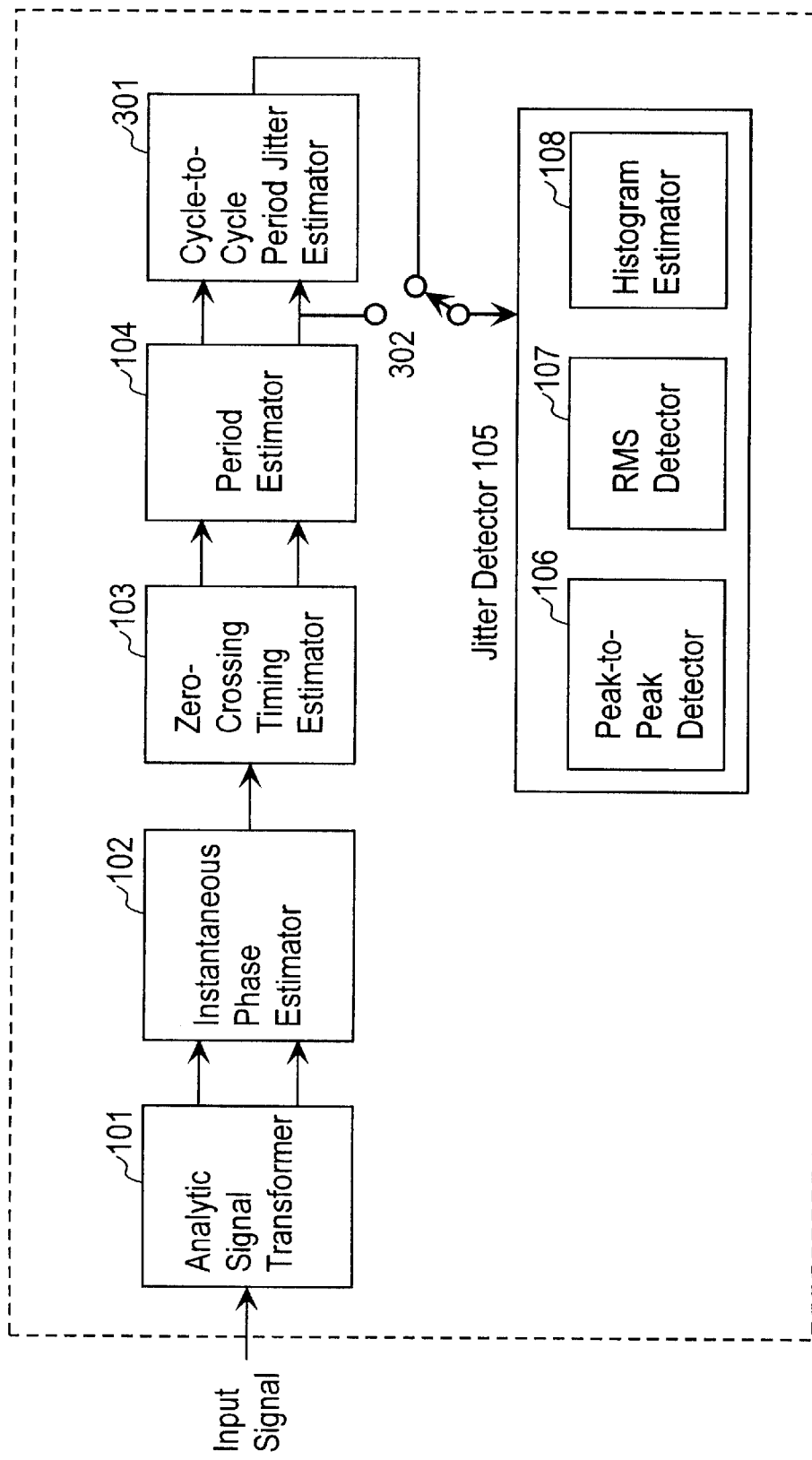
FIG. 28 is a diagram showing another example of the configuration of the jitter measurement apparatus according to the present invention.

FIG. 28 shows another example of the configuration of the jitter measurement apparatus used in the embodiment of the present invention. This jitter measurement apparatus 300 is same as the jitter measurement apparatus shown in FIG. 26 except that the jitter measurement apparatus 300 comprises cycle-to-cycle period jitter estimation means 301 having as an input an instantaneous period sequence obtained from the period estimation means 104 for calculating a differential waveform of the instantaneous period sequence to output a cycle-to-cycle period jitter sequence, and a switch 302 for selecting a sequence from the period estimation means 104 or the cycle-to-cycle period jitter estimation means 301 (in order to simplify the description, the explanation of the duplicated portions will be omitted). In this case, the jitter detection means 105 obtains jitters (a peak-to-peak value, an RMS value, and a histogram) of the signal under measurement from the instantaneous period sequence or the cycle-to-cycle period jitter sequence.

Figure 29:
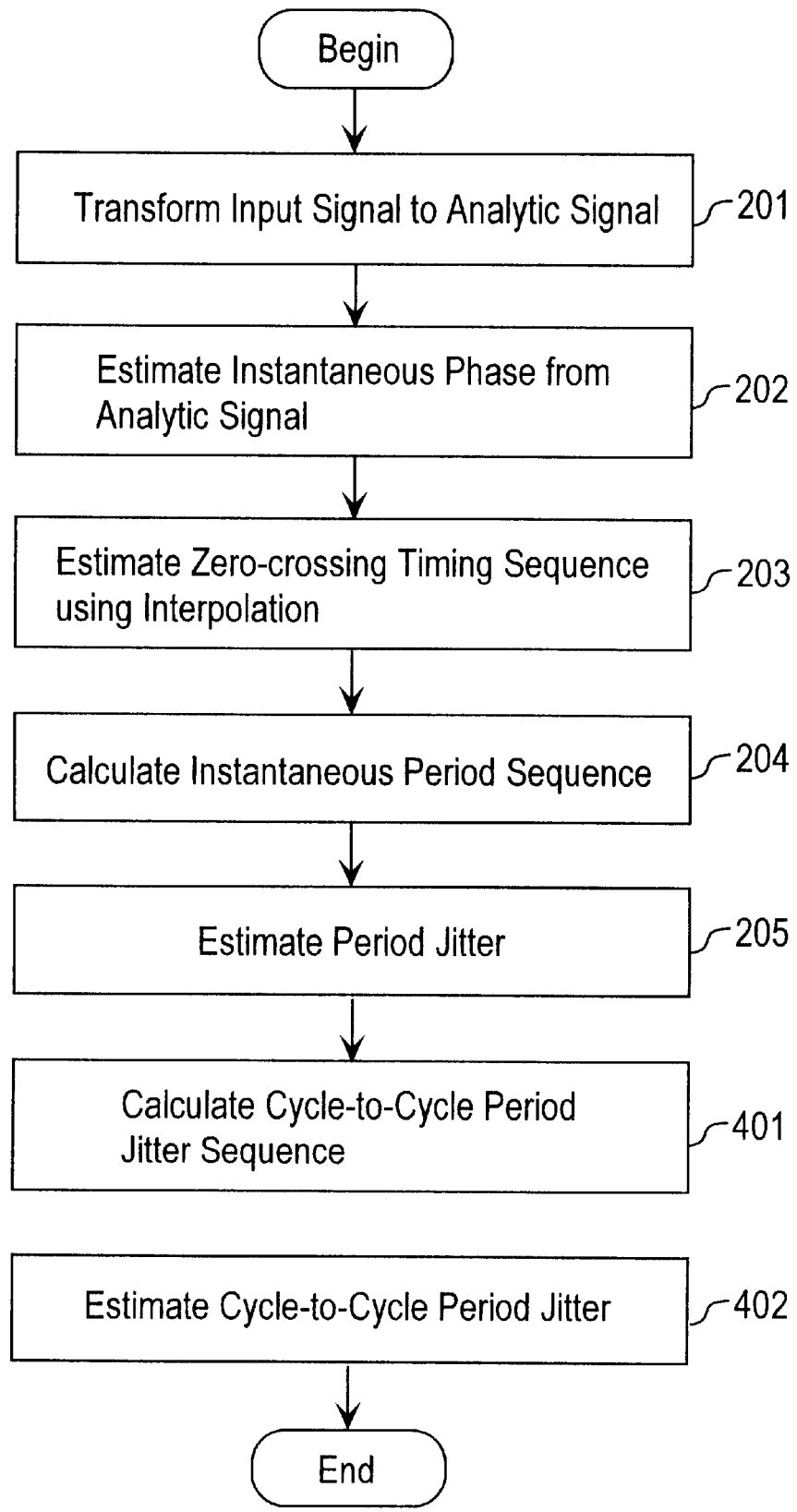
FIG. 29 is a flow-chart showing another example of the jitter measurement method according to the present invention.

Next, the operation in the case of performing a jitter measurement of a signal under measurement using the jitter measurement apparatus 300 according to the present invention will be described. FIG. 29 shows another processing procedure of the jitter measurement method according to the present invention. This jitter measurement method is same as the jitter measurement method shown in FIG. 27 except that this jitter measurement method comprises a step 401 for calculating by the cycle-to-cycle period jitter estimation means 301, after obtaining a period jitter of the signal under measurement from the instantaneous period sequence in the step 205 in FIG. 27, a differential waveform of the instantaneous period sequence estimated by the period estimation means 104 to obtain a cycle-to-cycle period jitter sequence of the signal under measurement, and a step 402 for obtaining a cycle-to-cycle period jitter of the signal under measurement from the cycle-to-cycle period jitter sequence in the state that the switch 302 connects the jitter detection means 105 to the output side of the cycle-to-cycle period jitter estimation means 301 (in order to simplify the description, the explanation of the duplicated portions will be omitted). In the step 402 for obtaining a cycle-to-cycle period jitter of the signal under measurement, the peak-to-peak detection means 106 obtains a peak-to-peak value of cycle-to-cycle period jitter using the equation (7), the RMS detection means 107 obtains an RMS value of cycle-to-cycle period jitter using the equation (6), and the histogram estimation means 108 obtains a histogram from the cycle-to-cycle period jitter sequence.

The jitter measurement apparatus shown in FIG. 28 can also be configured as an apparatus for estimating an only cycle-to-cycle period jitter. In this case, the switch 302 for selecting a sequence is omitted. Similarly, the jitter measurement method shown in FIG. 29 may estimate an only cycle-to-cycle period jitter. In this case, the step 205 for estimating a period jitter from the instantaneous period sequence is omitted.

Figure 30:
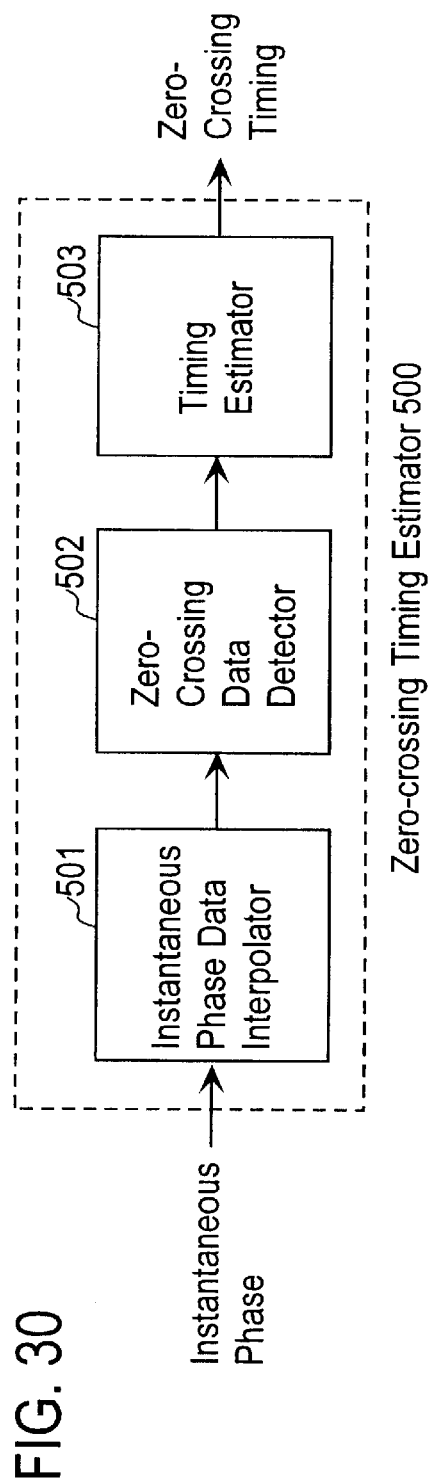
FIG. 30 is a diagram showing an example of a configuration of zero-crossing timing estimation means used in the jitter measurement apparatus according to the present invention.

FIG. 30 shows an example of a configuration of zero-crossing timing estimation means used in the jitter measurement apparatus 100 according to the present invention. The zero-crossing timing estimation means 500 comprises instantaneous phase data interpolation means 501 for interpolating instantaneous phase data between a plurality of instantaneous phase data around a predetermined value ($\pi/2+2n\pi$ or $3\pi/2+2n\pi$ (n=0, 1, 2, . . . ) or both) in the instantaneous phases estimated by the instantaneous phase estimation means 102, zero-crossing data determination means 502 for determining an instantaneous phase data closest to the predetermined value in the data-interpolated instantaneous phase data, and timing estimation means 503 for estimating a timing of the determined data. The instantaneous phase data interpolation means 501 may interpolate instantaneous phase data using the polynomial interpolation method, may interpolate instantaneous phase data using the cubic spline interpolation method, or may use another interpolation method.

Figure 31:
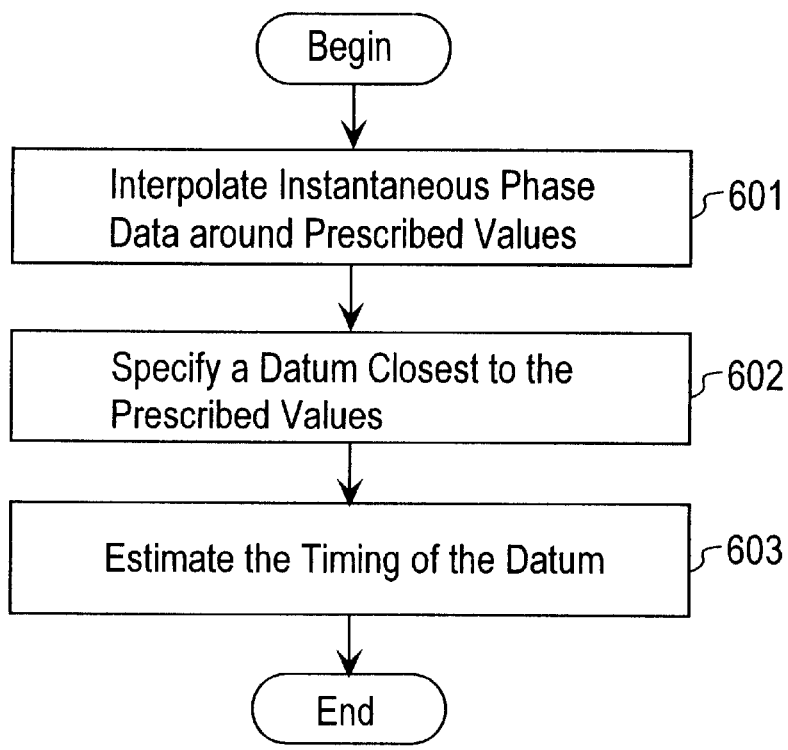
FIG. 31 is a flow-chart showing an example of a zero-crossing timing estimation method used in the jitter measurement method according to the present invention.

The operation of estimating a zero-crossing timing of a signal under measurement using this zero-crossing timing estimation means 500 will be described. FIG. 31 shows a processing procedure of the zero-crossing timing estimation method. First, in step 601, the instantaneous phase data interpolation means 501 interpolates in sufficient detail instantaneous phase data between a plurality of instantaneous phase data around a predetermined phase value in the instantaneous phases of the signal under measurement. Next, in step 602, the zero-crossing data determination means 502 determines an instantaneous phase data closest to the predetermined phase value in the interpolated instantaneous phase data. Finally, in step 603, the timing estimation means 503 obtains a timing of the determined instantaneous phase data on the time axis, and the process ends.

Figure 32:
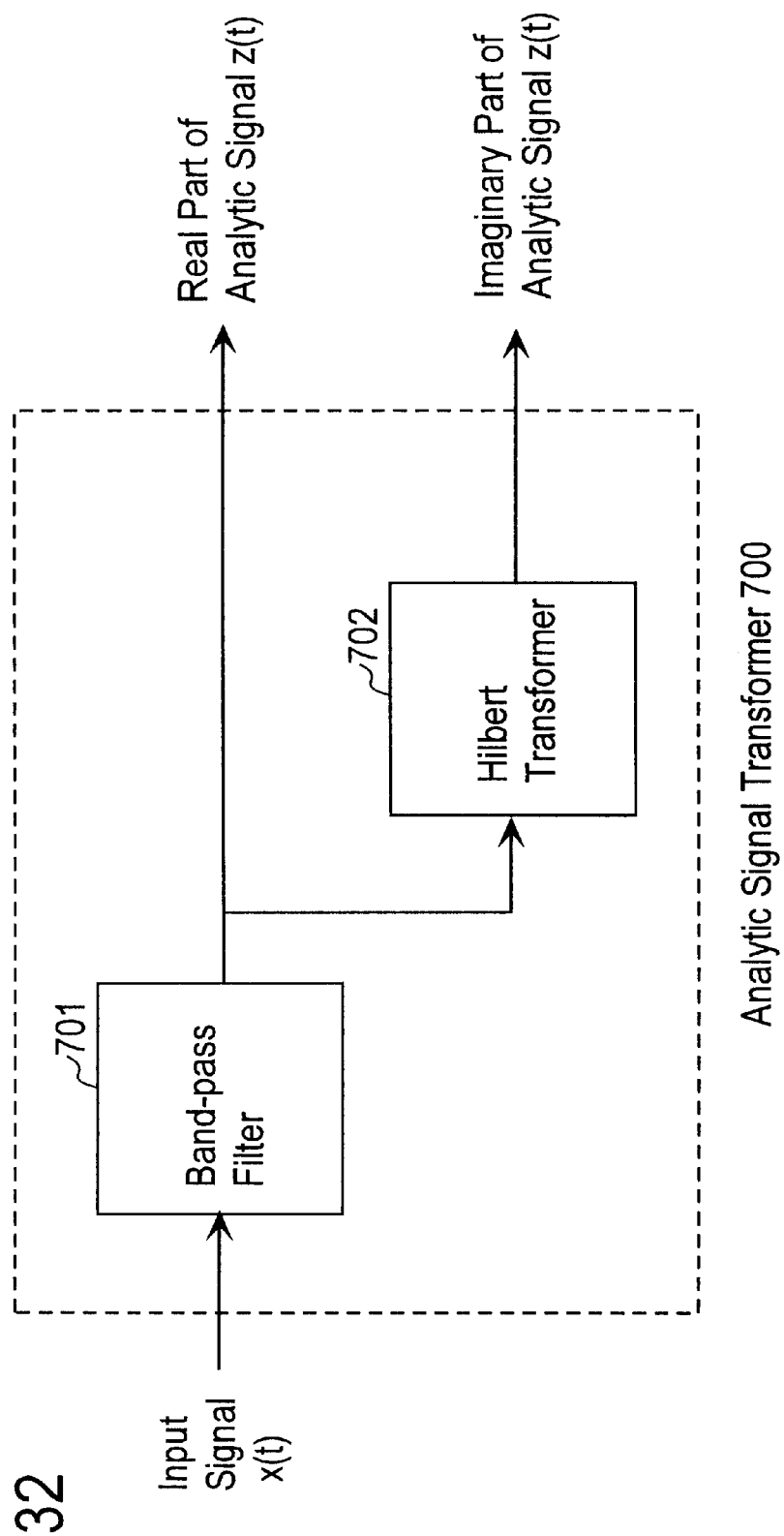
FIG. 32 is a diagram showing an example of a configuration of analytic signal transformation means used in the jitter measurement apparatus according to the present invention.

FIG. 32 shows an example of a configuration of analytic signal transformation means used in the jitter measurement apparatus 100 according to the present invention. This analytic signal transformation means 700 comprises band-pass filtering means 701 for extracting only components around a fundamental frequency from the signal under measurement to limit the bandwidth of the signal under measurement, and Hilbert transformation means 702 for branching and inputting therein an output signal of the band-pass filtering means 701 to Hilbert-transform the output signal and to generate a Hilbert pair of the input signal. This analytic signal transformation means 700 outputs a complex analytic signal z(t) having an output signal of the band-pass filtering means 701 as a real part and an output signal of the Hilbert transformation means 702 as an imaginary part. The band-pass filtering means 701 may be an analog filter or a digital filter, or may be packaged using digital signal processing such as FFT.

Figure 33:
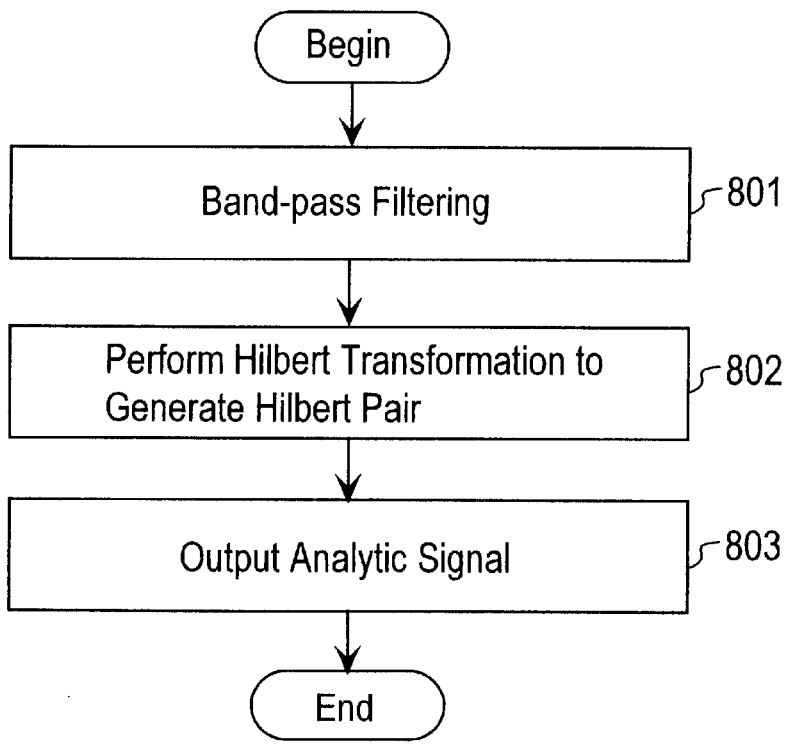
FIG. 33 is a flow-chart showing an example of a signal transformation method used in the jitter measurement method according to the present invention.

Next, the operation in the case of transforming a signal under measurement into a band-limited analytic signal using this analytic signal transformation means 700 will be described. FIG. 33 shows a processing procedure of this signal transformation method. First, in step 801, the band-pass filtering means 701 extracts only components around a fundamental frequency from the signal under measurement to limit the bandwidth of the signal under measurement. Next, in step 802, the Hilbert transformation means 702 applies Hilbert transformation to the band-limited signal under measurement to generate a Hilbert pair of the input signal corresponding to the imaginary part of the analytic signal. Finally, in step 803, the analytic signal transformation means 700 outputs the output signal of the band-pass filtering means 701 as a real part of the analytic signal and the output signal of the Hilbert transformation means 702 as an imaginary part of the analytic signal, and the process ends.

Figure 34:
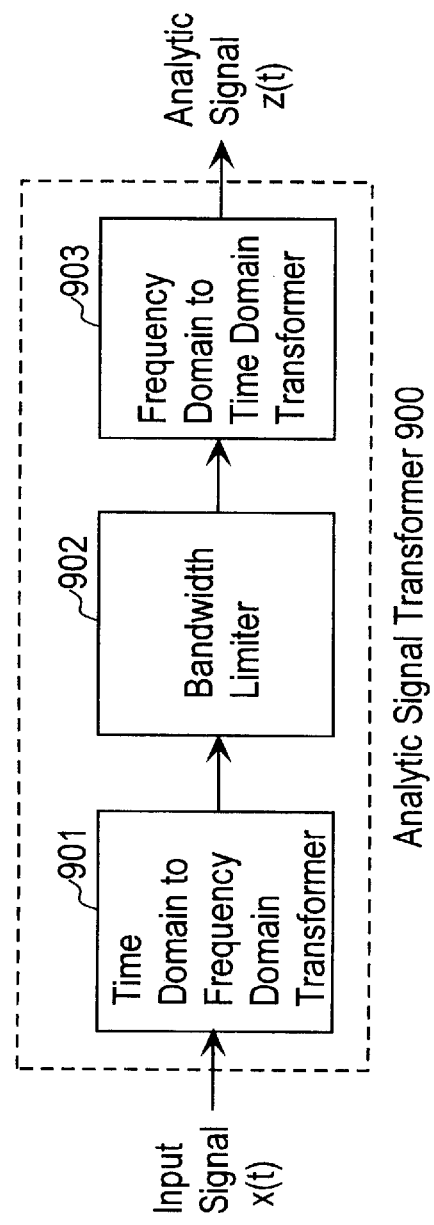
FIG. 34 is a diagram showing another example of the configuration of the analytic signal transformation means used in the jitter measurement apparatus according to present invention.

FIG. 34 shows another example of the configuration of the analytic signal transformation means used in the jitter measurement apparatus 100 according to the present invention. This analytic signal transformation means 900 comprises time domain to frequency domain transformation means 901 for transforming the signal under measurement into a both-sided spectrum signal in frequency domain, bandwidth limiting means 902 for extracting only components around a positive fundamental frequency in the both-sided spectrum signal in frequency domain, and frequency domain to time domain transformation means 903 for inverse-transforming an output of the bandwidth limiting means into a signal in time domain. The time domain to frequency domain transformation means 901 and the frequency domain to time domain transformation means 903 may be packaged using FFT and inverse FFT, respectively.

Figure 35:
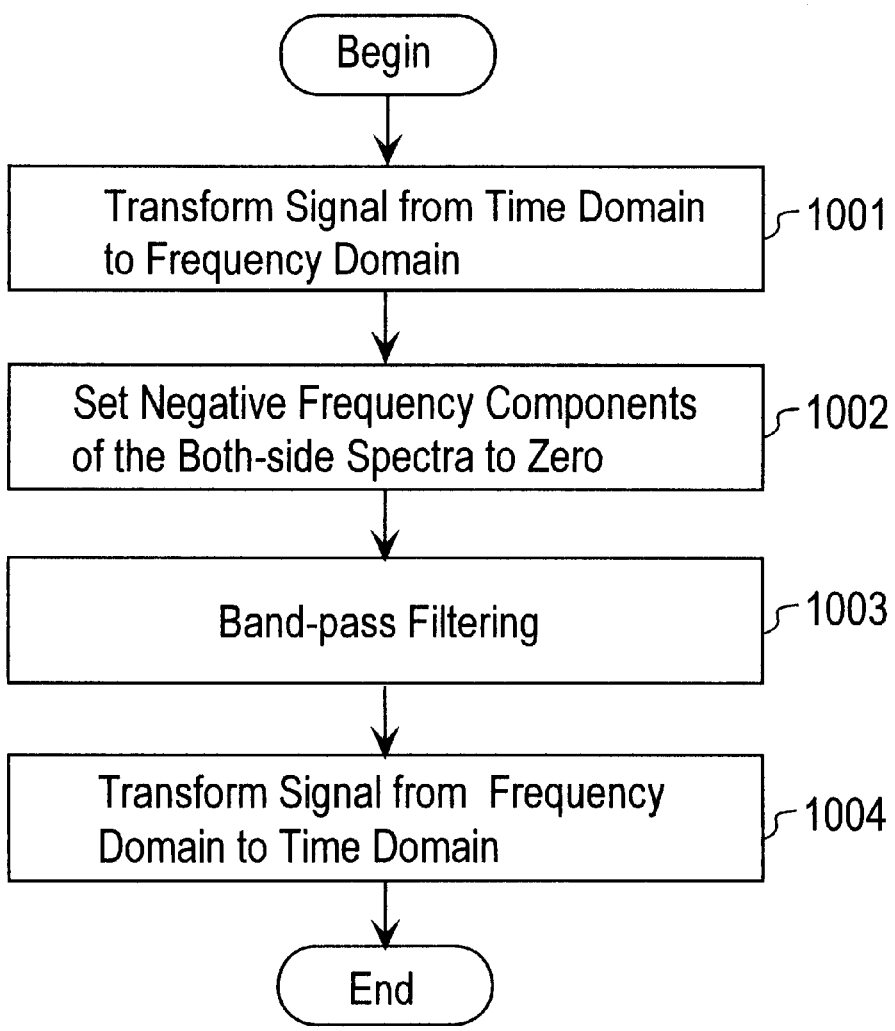
FIG. 35 is a flow-chart showing another example of the signal transformation method used in the jitter measurement method according to the present invention.

Next the operation in the case of transforming a signal under measurement into a band-limited analytic signal using this analytic signal transformation means 900 will be described. FIG. 35 shows another processing procedure of this signal transformation method. First, in step 1001, the time domain to frequency domain transformation means 901 applies FFT to the signal under measurement to transform the signal in time domain into a both-sided spectrum signal in frequency domain. Next in step 1002, the bandwidth limiting means 902 replaces negative frequency components of the transformed both-sided spectrum signal in frequency domain with zero. Then in step 1003, the bandwidth limiting means 902 retains only components around the fundamental frequency of the signal under measurement and replaces the other frequency components with zero in the single-sided spectrum signal produced by replacing the negative frequency components with zero to limit the bandwidth of the signal in frequency domain. Finally, in step 1004, the frequency domain to time domain transformation means 903 applies inverse FFT to the band-limited single-sided spectrum signal to transform the signal in frequency domain into an analytic signal in time domain, and the process ends. The processing sequence of the step 1002 and the step 1003 may be changed, i.e., only components around the fundamental frequency of the signal under measurement are retained and the other frequency components are replaced with zero first to limit the bandwidth of the signal in frequency domain, and thereafter negative frequency components of the both-sided spectrum signal may be replaced with zero.

Figure 36:
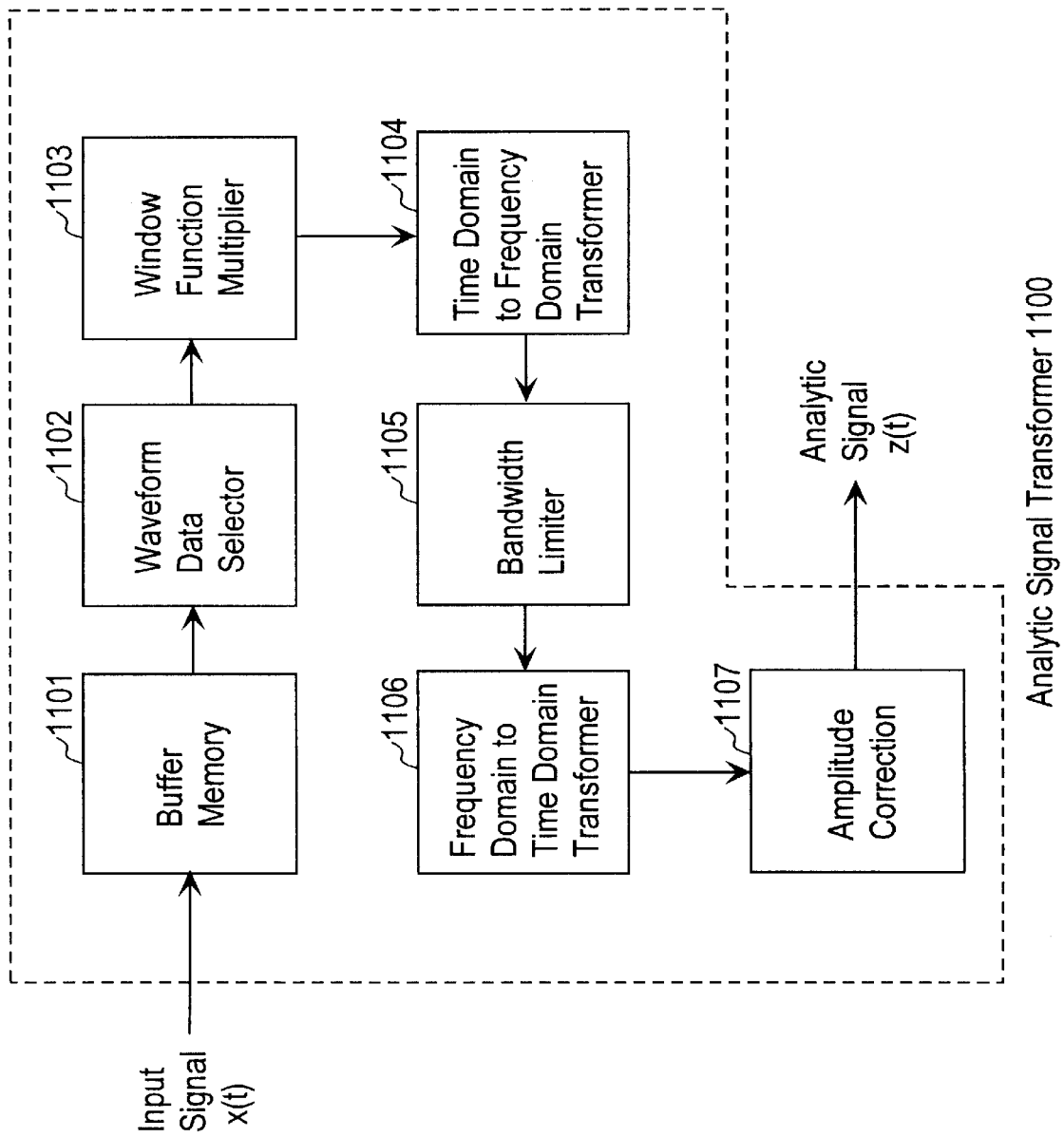
FIG. 36 is a diagram showing further another example of the configuration of the analytic signal transformation means used in the jitter measurement apparatus according to the present invention.

FIG. 36 shows another example of the configuration of the analytic signal transformation means used in the jitter measurement apparatus 100 according to the present invention. This analytic signal transformation means 1100 comprises a buffer memory 1101 for storing therein a signal under measurement, signal taking out means (waveform data selecting means) 1102 for taking out the signal in the sequential order from the buffer memory 1101 such that the signal being taken out is partially overlapped with the signal taken out just before, window function multiplication means 1103 for multiplying each taken out partial signal by a window function, time domain to frequency domain transformation means 1104 for transforming each partial signal multiplied by the window function into a both-sided spectrum signal in frequency domain, bandwidth limiting means 1105 for extracting only components around a positive fundamental frequency of the signal under measurement from the both-sided spectrum signal transformed in frequency domain, frequency domain to time domain transformation means 1106 for inverse-transforming an output of the bandwidth limiting means 1105 into a signal in time domain, and inverse window function multiplication means 1107 for multiplying the signal transformed in time domain by an inverse number of the window function to obtain a band-limited analytic signal. The time domain to frequency domain transformation means 1104 and the frequency domain to time domain transformation means 1106 may be packaged using FFT and inverse FFT, respectively.

Figure 37:
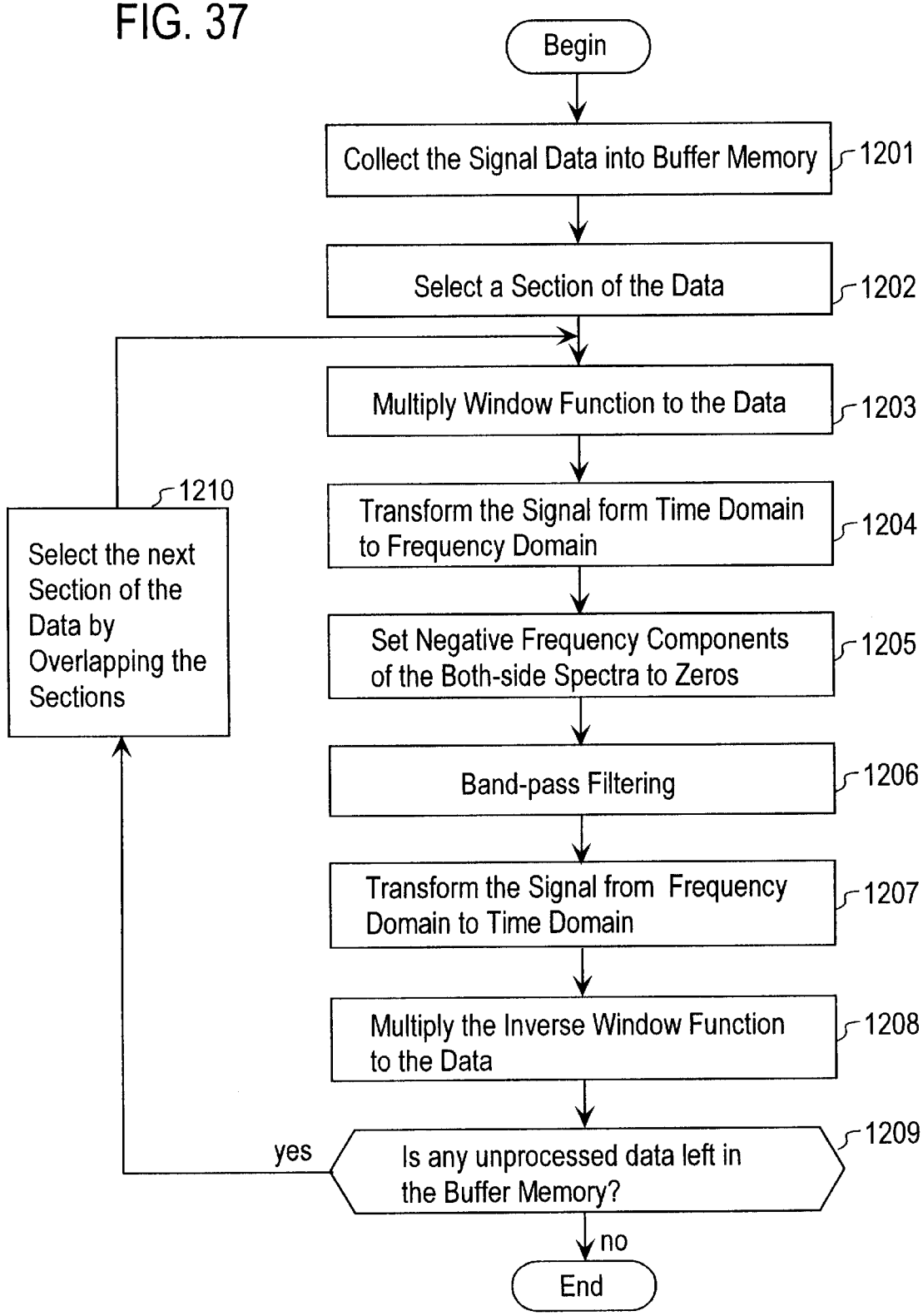
FIG. 37 is a flow-chart showing further another example of the signal transformation method used in the jitter measurement method according to the present invention.

Next the operation in the case of transforming the signal under measurement into a band-limited analytic signal using this analytic signal transformation means 1100 will be described. FIG.37 shows another processing procedure of this analytic signal transformation method. First, in step 1201, the buffer memory 1101 stores therein the signal under measurement. Next, in step 1202, the signal taking out means (waveform data selecting means) 1102 takes out a portion of the stored signal from the buffer memory 1101. Next, in step 1203, the window function multiplication means 1103 multiplies the taken out partial signal by the window function. Next, in step 1204, the time domain to frequency domain transformation means 1104 applies FFT to the partial signal multiplied by the window function to transform the signal in time domain into a both-sided spectrum signal in frequency domain. Next in step 1205, the bandwidth limiting means 1105 replaces negative frequency components of the transformed both-sided spectrum signal in frequency domain with zero. Then in step 1206, the bandwidth limiting means 1105 retains only components around the fundamental frequency of the signal under measurement in the single-sided spectrum signal produced by replacing negative frequency components with zero and replaces the other frequency components with zero to limit the bandwidth of the signal in frequency domain. Next, in step 1207, the frequency domain to time domain transformation means 1106 applies inverse FFT to the band-limited single-sided spectrum signal in frequency domain to transform the signal in frequency domain into a signal in time domain. Next, in step 1208, the inverse window function multiplication means 1107 multiplies the inverse-transformed signal in time domain by an inverse number of the window function multiplied in the step 1203 to obtain a band-limited analytic signal. Finally, in step 1209, a check is made to see if there is unprocessed data remaining in the buffer memory. If there is unprocessed data remaining in the buffer memory, the signal taking out means (waveform data selecting means) 1102 takes out, in step 1210, the signal in the sequential order from the buffer memory 1101 such that the signal being taken out is partially overlapped with the signal taken out just before, and thereafter the steps 1203, 1204, 1205, 1206, 1207, 1208 and 1209 are repeated. If there is no unprocessed data, the process ends. The processing sequence of the step 1205 and the step 1206 may be changed, i.e., only components around the fundamental frequency of the signal under measurement are retained and the other frequency components are replaced with zero first to limit the bandwidth of the signal in frequency domain, and thereafter negative frequency components of the both-sided spectrum signal may be replaced with zero.

Figure 38:
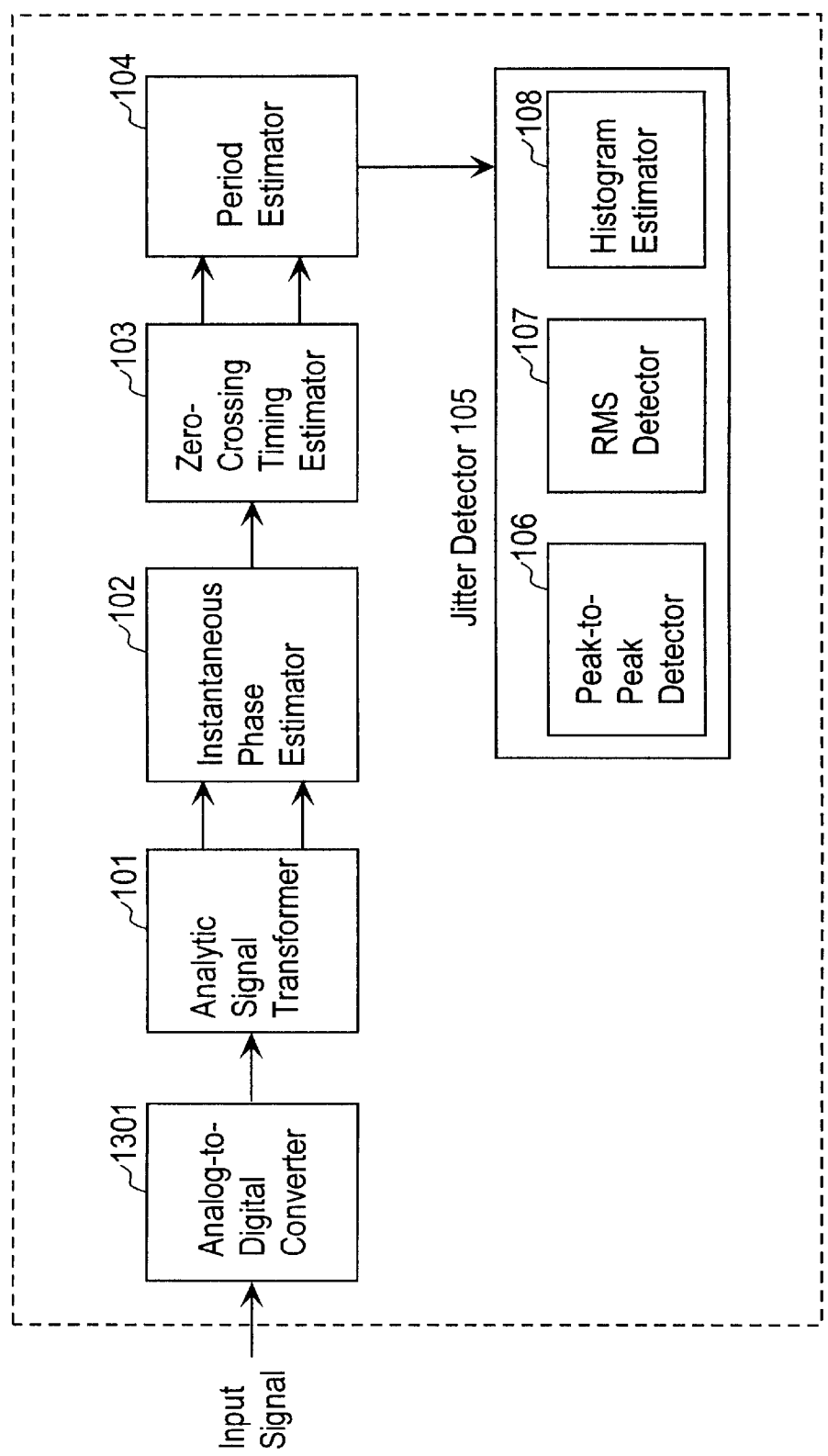
FIG. 38 is a diagram showing another example of the configuration of the jitter measurement apparatus according to the present invention.

FIG. 38 shows another embodiment of the configuration of the jitter measurement apparatus according to the present invention. This jitter measurement apparatus 1300 is same as the jitter measurement apparatus shown in FIG. 26 except that the jitter measurement apparatus 1300 includes AD conversion means 1301 for digitizing an analog signal under measurement to convert it to a digital signal (in order to simplify the description, the explanation of the duplicated portions will be omitted). It is desirable that a high speed AD converter, digitizer, or digital sampling oscilloscope is used as the AD conversion means.

Figure 39:
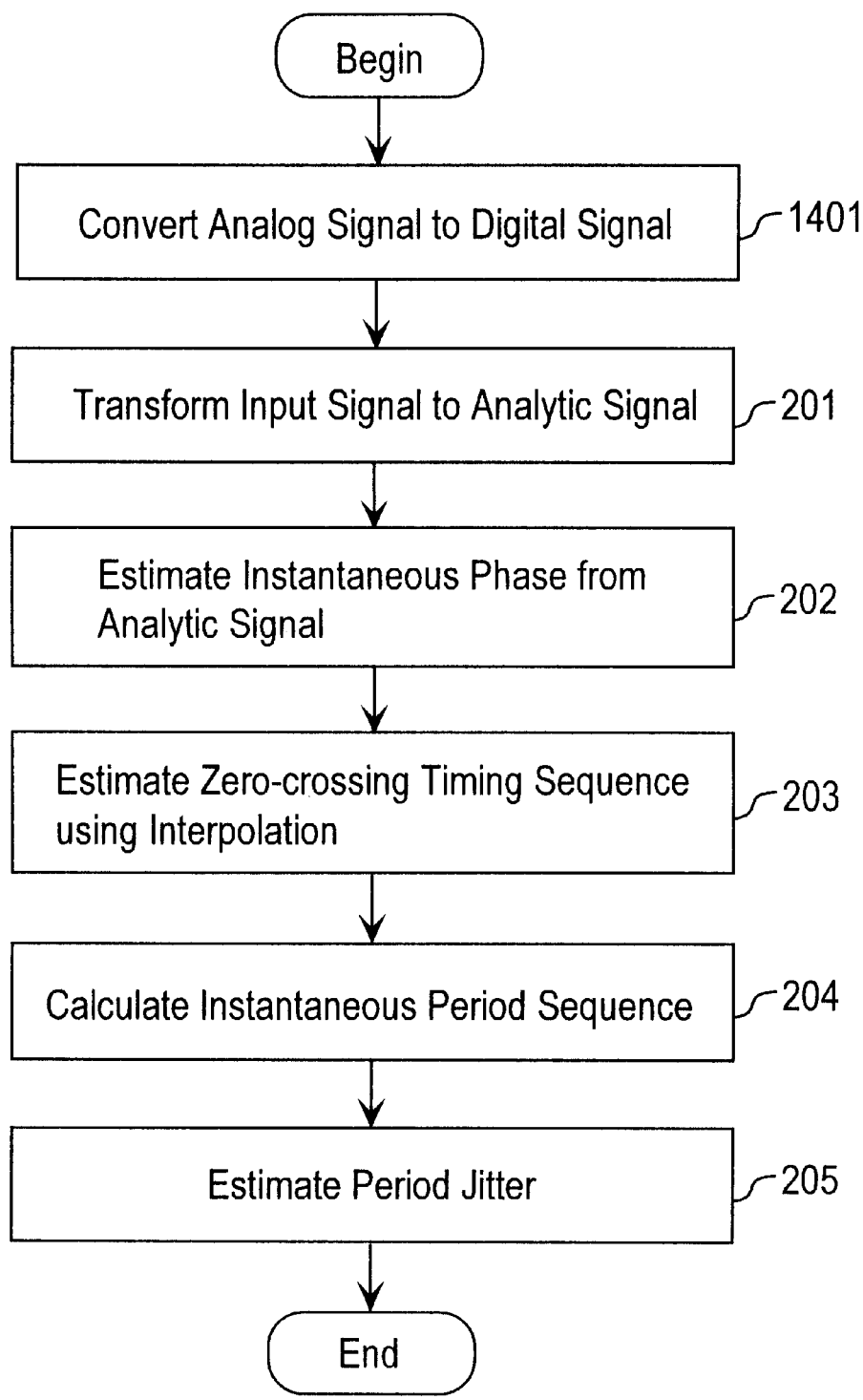
FIG. 39 is a flow-chart showing another example of the jitter measurement method according to the present invention.

Next, the operation in the case of performing a jitter measurement of a signal under measurement using the jitter measurement apparatus 1300 will be described. FIG. 39 shows another processing procedure of the jitter measurement method according to the present invention. This jitter measurement method is same as the jitter measurement method shown in FIG. 27 except that this jitter measurement method includes, at the beginning of the process, a step 1401 for sampling (digitizing) an analog signal under measurement whose jitter is to be measured and for converting it to a digital signal by the AD conversion means 1301 (in order to simplify the description, the explanation of the duplicated portions will be omitted).

The AD conversion means can also be built in the jitter measuring apparatus 300 having the cycle-to-cycle period jitter estimation means shown in FIG. 28. In this case, the processing procedure of the jitter measurement method shown in FIG. 29 includes, at the beginning of the process, a step of sampling (digitizing) an analog signal under measurement whose jitter is to be measured and converting it to a digital signal by the AD conversion means 1301.

Figure 40:
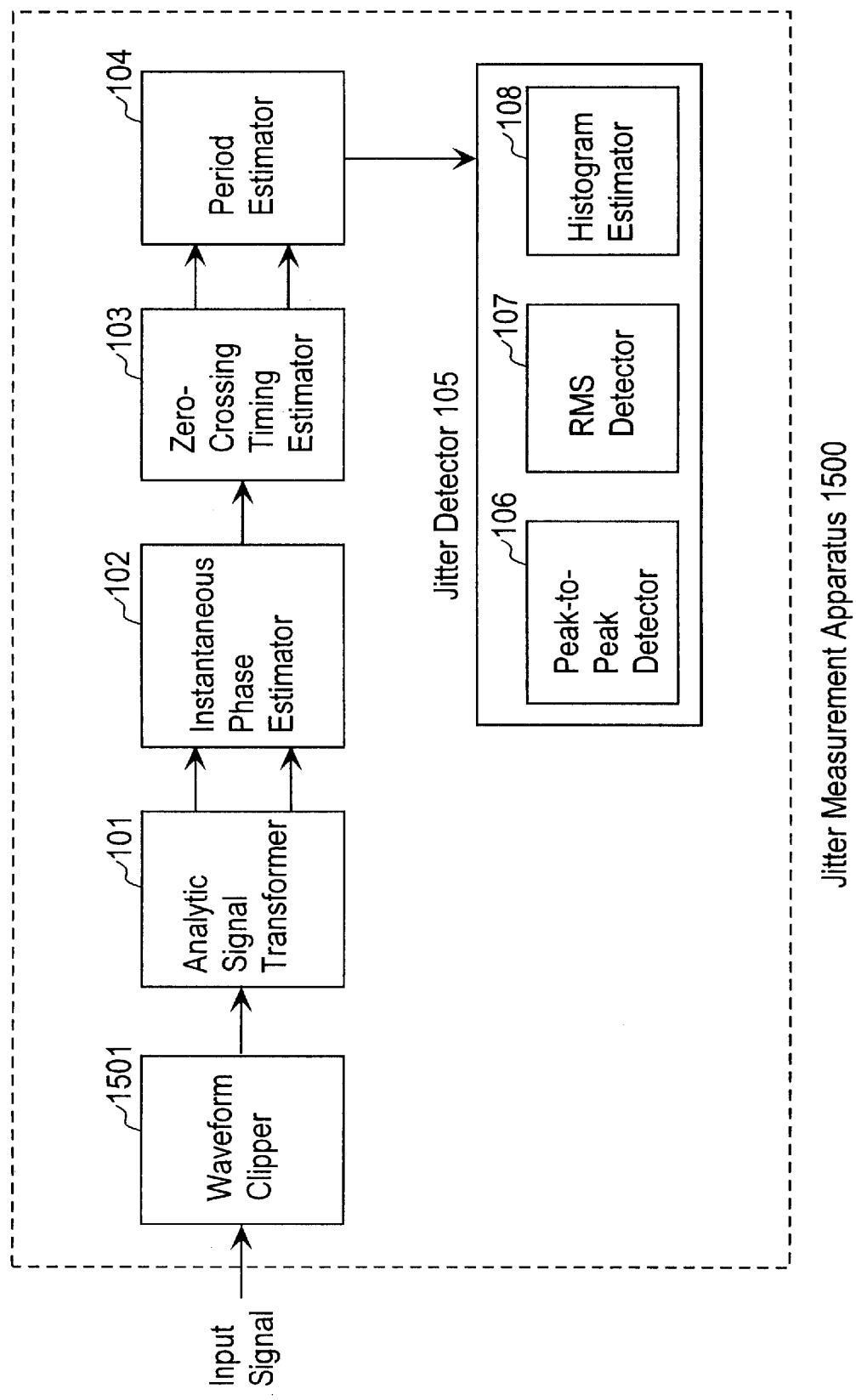
FIG. 40 is a diagram showing further another example of the configuration of the jitter measurement apparatus according to the present invention.

FIG. 40 shows another embodiment of the configuration of the jitter measurement apparatus according to the present invention. This jitter measurement apparatus 1500 is same as the jitter measurement apparatus shown in FIG. 26 except that the jitter measurement apparatus 1500 includes waveform clipping means 1501 for removing AM components of the signal (in order to simplify the description, the explanation of the duplicated portions will be omitted).

Figure 41:
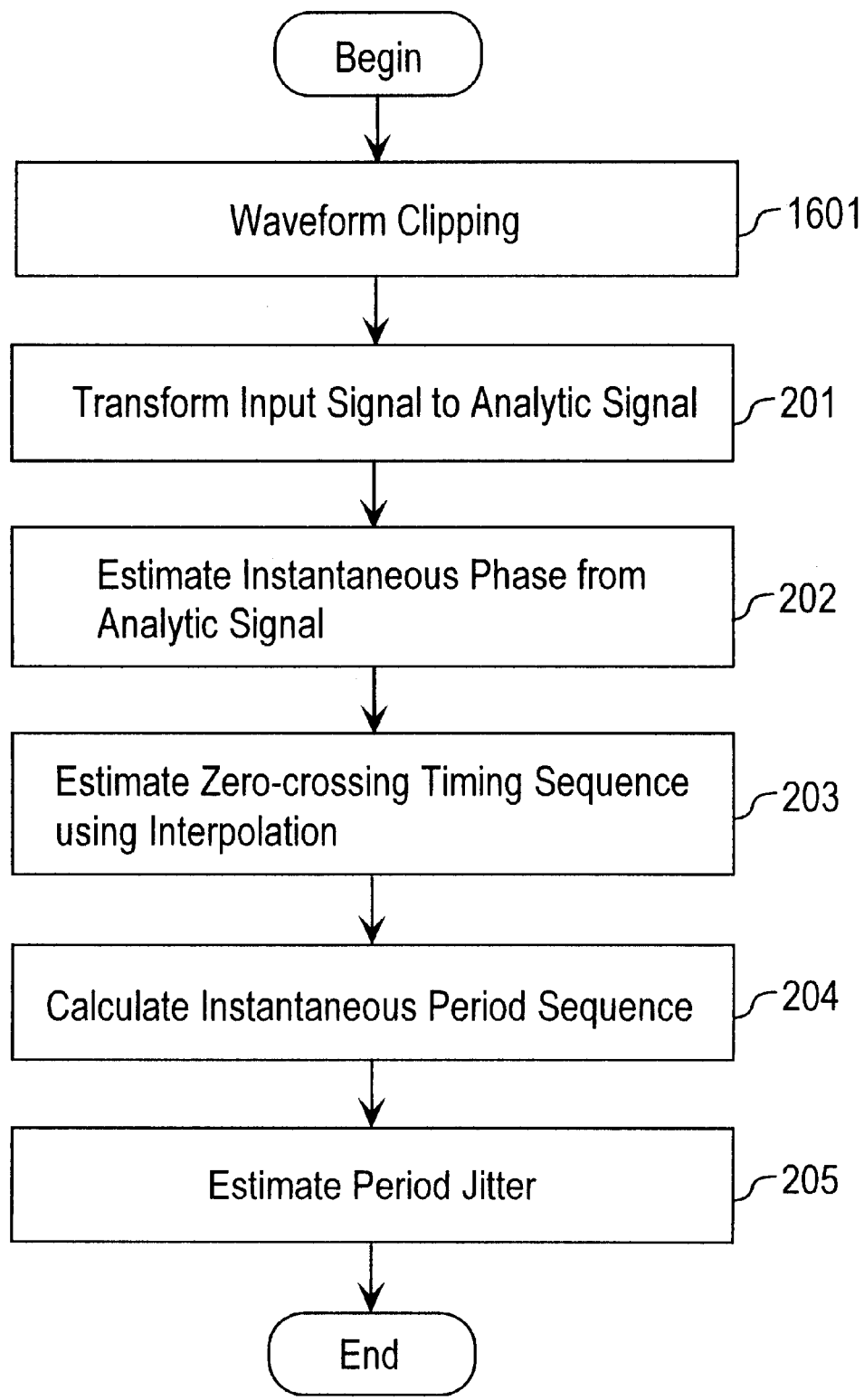
FIG. 41 is a flow-chat showing further another example of the jitter measurement method according to the present invention.

Next, the operation in the case of performing a jitter measurement of a signal under measurement using the jitter measurement apparatus 1500 will be described. FIG. 41 shows another processing procedure of the jitter measurement method. This jitter measurement method is same as the jitter measurement method shown in FIG. 27 except that this jitter measurement method includes a step 1601 in which the waveform clipping means 1501 removes, at the beginning of the process, AM components of the signal under measurement (in order to simplify the description, the explanation of the duplicated portions will be omitted).

The waveform clipping means can also be built in the jitter measurement apparatus 300 having the cycle-to-cycle period jitter estimation means shown in FIG. 28. In this case, the processing procedure of the jitter measurement method shown in FIG. 29 includes, at the beginning of the process, a step in which the waveform clipping means removes AM components of the signal under measurement.

As mentioned above, according to the jitter measurement apparatus and the jitter measurement method according to the present invention, by estimating an instantaneous phase from signal data sampled at high speed, and by estimating a zero-crossing timing, period jitter values compatible with the conventional time interval analyzer method and Δϕ method can be estimated. Therefore, accuracy of the jitter measurement (using interpolation-based jitter measurement method) using the conventional oscilloscope can significantly be improved.

In addition, if a zero-crossing timing is estimated using the interpolation method or the inverse interpolation method, a jitter can be measured with much higher accuracy.

Furthermore, if a cycle-to-cycle period jitter sequence is obtained, a simultaneous measurement of a period jitter and a cycle-to-cycle period jitter that is difficult in the conventional time interval analyzer method becomes possible. Therefore, the efficiency of the jitter measurement can be improved greatly.

In addition, according to the jitter measurement apparatus and jitter measurement method of the present invention, there is no dead time in this jitter measurement. Therefore, the measurement time can be reduced compared with the conventional time interval analyzer method.

What is claimed is:

1. A jitter measurement apparatus comprising:
    an analytic signal transformer for transforming a signal under measurement into a complex analytic signal;
    an instantaneous phase estimator for obtaining an instantaneous phase of the signal under measurement from the complex analytic signal transformed by said analytic signal transformer;
    a zero-crossing timing estimator for obtaining a zero-crossing timing sequence of the signal under measurement from the estimated instantaneous phase;
    a period estimator for obtaining an instantaneous period sequence of the signal under measurement from the zero-crossing timing sequence estimated by said zero-crossing timing estimator; and
    a jitter detector to which the instantaneous period sequence is supplied for obtaining a jitter of the signal under measurement.

2. The jitter measurement apparatus according to claim 1 further comprising:
    a cycle-to-cycle period jitter estimator to which the instantaneous period sequence is inputted for calculating its differential sequence and for outputting a cycle-to-cycle period jitter sequence of the signal under measurement to supply it to said jitter detector.

3. The jitter measurement apparatus according to claim 1 or 2 wherein said zero-crossing timing estimator comprises:
    an instantaneous phase data interpolator to which the instantaneous phases are supplied for interpolating instantaneous phase data between a plurality of instantaneous phase data around a predetermined phase value in the instantaneous phases;
    zero-crossing data determination means for determining a data closest to the predetermined phase value in the data-interpolated instantaneous phase data; and
    a timing estimator for estimating a timing of the determined data.

4. The jitter measurement apparatus according to claim 1 or 2 wherein said zero-crossing timing estimator is means to which the instantaneous phase data are supplied for estimating a zero-crossing timing sequence using an inverse interpolation from a plurality of instantaneous phase data around predetermined values in the supplied instantaneous phases to output the zero-crossing timing sequence.

5. The jitter measurement apparatus according to claim 1 or 2 wherein said analytic signal transformer comprises:
    a band-pass filter to which the signal under measurement is supplied for extracting only components around a fundamental frequency from the signal under measurement to limit the bandwidth of the signal under measurement; and
    a Hilbert transformer for Hilbert-transforming an output signal of said band-pass filter to generate a Hilbert pair of the input signal.

6. The jitter measurement apparatus according to claim 1 or 2 wherein said analytic signal transformer comprises:
    a time domain to frequency domain transformer to which the signal under measurement is supplied for transforming the signal under measurement into a both-sided spectrum signal in frequency domain;
    a bandwidth limiter for extracting only components around a positive fundamental frequency in the both-sided spectrum signal; and
    a frequency domain to time domain transformer for inverse-transforming an output of said bandwidth limiter into a signal in time domain.

7. The jitter measurement apparatus according to claim 1 or 2 further comprising a waveform clipper to which the signal under measurement is inputted for removing amplitude modulation components of the signal under measurement to extract only phase modulation components of the signal under measurement and to output the extracted phase modulation components to said analytic signal transformer.

8. The jitter measurement apparatus according to claim 1 or 2 wherein said jitter detector is a peak-to-peak detector for obtaining a difference between the maximum value and the minimum value of the supplied sequence.

9. The jitter measurement apparatus according to claim 1 or 2 wherein said jitter detector is a root mean square detector for obtaining an RMS (root mean square) value of the supplied sequence.

10. The jitter measurement apparatus according to claim 1 or 2 wherein said jitter detector is a histogram estimator for obtaining a histogram of the supplied sequence.

11. A jitter measurement method comprising the steps of:
    transforming a signal under measurement into a complex analytic signal;
    estimating an instantaneous phase of the signal under measurement from the complex analytic signal;
    estimating a zero-crossing timing sequence of the signal under measurement from the instantaneous phase;
    estimating an instantaneous period sequence of the signal under measurement from the zero-crossing timing sequence; and obtaining a jitter of the signal under measurement from the instantaneous period sequence.

12. The jitter measurement method according to claim 11 further comprising the step of:

provuding the instantaneous period sequence as an input for calculating its differential sequence and for outputting a cycle-to-cycle period jitter sequence of the signal under measurement.

13. The jitter measurement method according to claim 12 wherein said step of obtaining a jitter is a step of obtaining a root mean square value of the cycle-to-cycle period jitter sequence to calculate an RMS value.

14. The jitter measurement method according to claim 11 or 12 wherein said step of estimating a zero-crossing timing sequence comprises the steps of:

interpolating instantaneous phase data between a plurality of instantaneous phase data around a predetermined phase value in the instantaneous phases;

determining a data closest to the predetermined phase value in the data-interpolated instantaneous phases; and estimating a timing of the determined data.

15. The jitter measurement method according to claim 14 wherein said step of interpolating data around the predetermined value is a step of interpolating using a polynomial interpolation.

16. The jitter measurement method according to claim 14 wherein said step of interpolating data around the predetermined value is a step of interpolating data around the zero-crossing of the instantaneous phase using a cubic spline interpolation.

17. The jitter measurement method according to claim 11 or 12 wherein said step of estimating a zero-crossing timing sequence is a step of inputting the instantaneous phases and estimating a zero-crossing timing sequence using an inverse interpolation from a plurality of instantaneous phase data around predetermined values in the inputted instantaneous phases.

18. The jitter measurement method according to claim 17 wherein the inverse interpolation is an inverse linear interpolation.

19. The jitter measurement method according to claim 11 or 12 wherein said step of transforming the signal under measurement into an analytic signal comprises the steps of:

extracting only components around a fundamental frequency from the signal under measurement to limit the bandwidth of the signal under measurement; and Hilbert-transforming the band-limited signal under measurement to generate a Hilbert pair of the input signal.

20. The jitter measurement method according to claim 11 or 12 wherein said step of transforming the signal under measurement into an analytic signal comprises the steps of:

transforming the signal under measurement into a both-sided spectrum signal in frequency domain;

extracting only components around a positive fundamental frequency in the both-sided spectrum signal; and inverse-transforming the extracted components around the positive fundamental frequency into a signal in time domain.

21. The jitter measurement method according to claim 11 or 12 wherein said step of transforming the signal under measurement into an analytic signal comprises the steps of:

storing the signal under measurement in a buffer memory;

taking out the signal in the sequential order from said buffer memory such that the signal being taken out is partially overlapped with the signal taken out just before;

multiplying each taken out partial signal by a window function;

transforming each partial signal multiplied by the window function into a both-sided spectrum signal in frequency domain;

extracting only components around a positive fundamental frequency of the signal under measurement from the both-sided spectrum signal transformed in frequency domain;

inverse-transforming the extracted spectrum signal having only components around the positive fundamental frequency into a signal in time domain; and multiplying the signal transformed in time domain by an inverse number of the window function to obtain a band-limited analytic signal.

22. The jitter measurement method according to claim 11 or 12 wherein said step of obtaining a jitter is a step of obtaining a difference between the maximum value and the minimum value of the sequence to calculate a peak-to-peak value.

23. The jitter measurement method according to claim 11 or 12 wherein said step of obtaining a jitter is a step of obtaining a standard deviation of the instantaneous period sequence to calculate an RMS value.

24. The jitter measurement method according to claim 11 or 12 wherein said step of obtaining a jitter is a step of obtaining a histogram data of the sequence.

* * * * *